(12) United States Patent
D'Evelyn et al.

(10) Patent No.: US 7,009,215 B2
(45) Date of Patent: Mar. 7, 2006

(54) GROUP III-NITRIDE BASED RESONANT CAVITY LIGHT EMITTING DEVICES FABRICATED ON SINGLE CRYSTAL GALLIUM NITRIDE SUBSTRATES

(75) Inventors: Mark Philip D'Evelyn, Niskayuna, NY (US); Xian-An Cao, Clifton Park, NY (US); Anping Zhang, Niskayuna, NY (US); Steven Francis LeBoeuf, Schenectady, NY (US); Huicong Hong, Niskayuna, NY (US); Dong-Sil Park, Niskayuna, NY (US); Kristi Jean Narang, Voorheesville, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/693,803

(22) Filed: Oct. 24, 2003

(65) Prior Publication Data

US 2005/0087753 A1   Apr. 28, 2005

(51) Int. Cl.
*H01L 33/00* (2006.01)
(52) U.S. Cl. .................. 257/98; 257/99; 257/100; 257/102; 257/103; 372/98; 372/99
(58) Field of Classification Search ............ 257/98, 257/99, 100, 102, 103; 372/98, 99
See application file for complete search history.

(56) References Cited

U.S. PATENT DOCUMENTS

| | | |
|---|---|---|
| 5,578,839 A | 11/1996 | Nakamura et al. |
| 5,637,531 A | 6/1997 | Porowski et al. |
| 5,770,887 A | 6/1998 | Tadatomo et al. |
| 5,796,771 A | 8/1998 | DenBaars et al. |
| 5,810,925 A | 9/1998 | Tadatomo et al. |
| 5,838,707 A | 11/1998 | Ramdani et al. |
| 5,874,747 A | 2/1999 | Redwing et al. |
| 5,877,038 A | 3/1999 | Coldren et al. |
| 5,962,975 A | 10/1999 | Lepselter |

(Continued)

FOREIGN PATENT DOCUMENTS

DE          10208170 A1      9/2003

(Continued)

OTHER PUBLICATIONS

Kamp et al., GaN Homoepitaxy for Device Applications, Kamp et al., MRS Internet J. Nitride Semicond. Res. 4SI, G10.2 (1999).

(Continued)

*Primary Examiner*—Minhloan Tran
*Assistant Examiner*—Tan Tran
(74) *Attorney, Agent, or Firm*—Shawn A. McClintic; William E. Powell, III

(57) ABSTRACT

In a method for producing a resonant cavity light emitting device, a seed gallium nitride crystal (14) and a source material (30) are arranged in a nitrogen-containing superheated fluid (44) disposed in a sealed container (10) disposed in a multiple-zone furnace (50). Gallium nitride material is grown on the seed gallium nitride crystal (14) to produce a single-crystal gallium nitride substrate (106, 106'). Said growing includes applying a temporally varying thermal gradient (100, 100', 102, 102') between the seed gallium nitride crystal (14) and the source material (30) to produce an increasing growth rate during at least a portion of the growing. A stack of group III-nitride layers (112) is deposited on the single-crystal gallium nitride substrate (106, 106'), including a first mirror sub-stack (116) and an active region (120) adapted for fabrication into one or more resonant cavity light emitting devices (108, 150, 160, 170, 180).

29 Claims, 14 Drawing Sheets

U.S. PATENT DOCUMENTS

| | | | |
|---|---|---|---|
| 5,977,612 | A | 11/1999 | Bour et al. |
| 6,015,979 | A | 1/2000 | Sugiura et al. |
| 6,031,858 | A | 2/2000 | Hatakoshi et al. |
| 6,100,586 | A | 8/2000 | Chen et al. |
| 6,140,669 | A | 10/2000 | Lozykowski et al. |
| 6,160,833 | A | 12/2000 | Floyd et al. |
| 6,255,669 | B1 | 7/2001 | Birkhahn et al. |
| 6,273,948 | B1 | 8/2001 | Porowski et al. |
| 6,280,523 | B1 | 8/2001 | Coman et al. |
| 6,294,440 | B1 | 9/2001 | Tsuda et al. |
| 6,320,206 | B1 | 11/2001 | Coman et al. |
| 6,339,014 | B1 | 1/2002 | Ishida et al. |
| 6,398,867 | B1 | 6/2002 | D'Evelyn et al. |
| 6,413,627 | B1 | 7/2002 | Motoki et al. |
| 6,504,180 | B1 | 1/2003 | Heremans et al. |
| 6,507,042 | B1 | 1/2003 | Mukai et al. |
| 6,515,308 | B1 | 2/2003 | Kneissl et al. |
| 2002/0140845 | A1 | 10/2002 | D'Evelyn et al. |
| 2002/0155634 | A1 | 10/2002 | D'Evelyn et al. |
| 2002/0189531 | A1 | 12/2002 | Tomasz et al. |
| 2003/0047744 | A1 | 3/2003 | Tomoya |
| 2003/0141301 | A1 | 7/2003 | D'Evelyn et al. |
| 2003/0183155 | A1 | 10/2003 | D'Evelyn et al. |
| 2004/0195598 | A1* | 10/2004 | Tysoe et al. ............... 257/233 |

FOREIGN PATENT DOCUMENTS

| | | |
|---|---|---|
| WO | WO 01/24285 A1 | 4/2001 |
| WO | WO 01/37351 A1 | 5/2001 |

OTHER PUBLICATIONS

Fini et al. In situ, Real-Time Measurement of Wing Tilt During Lateral Epitaxial Overgrowth of GaN; Applied Physics Letters, vol. 76, No. 26, Jun. 26, 2000.

Pelzmann et al., Blue Light-Emitting Diodes on GaN Substrates, Growth and Characterization, Journal of Crystal Growth 189/190 (1998) 167-171.

Porowski, High Pressure of Crystallization of III-V Nitrides, ACTA Physica Polonica A, vol. 87 (1995), No. 2.

Kim et al. Crystal tilting in GaN Grown by Pendoepitaxy Method on Sapphire Substrate, Applied Physics Letters, vol. 75, No. 26, Dec. 27, 1999.

Kuan et al., Dislocation Mechanisms in the GaN Lateral Overgrowth by Hydride Vapor Phase Epitaxy.

Sakai et al., Transmission Electron Microscopy of Defects in GaN Films Formed by Epitaxial Lateral Overgrowth, Applied Physics Letters, vol. 73, No. 4, Jul. 27, 1998.

Marchand et al., Microstructure of GaN Laterally Overgrown by Metalorganic Chemical Vapor Deposition, Applied Physics Letters, vol. 73, No. 6, Aug. 10, 1998.

Horibuchi et al., Behavior of Threading Dislocations in SAG-GaN Grown by MOVPE, phys. Stat. sol. (a) 180, 171 (2000).

Patent Abstract of Japan, Publication No. 2000-022212, Date Jan. 21, 2000.

D'Evelyn et al., Homoepitaxial Gallium-Nitride-Based Light Emitting Device and Method for Producing, U.S. Appl. No. 09/694,690; filed Oct. 23, 2000.

D'Evelyn et al., Gallium Nitride Crystal and Method of Making Same; U.S. Appl. No. 10/329,981.

Porowski, "Near defect-free GaN substrates" [MRS Internet J. Nitride Semicond. Research 4S1, G1.3 (1999)].

C. Van De Walle, Phys. Rev. B 56, R10020 (1997).

M.G. Weinstein et al., Appl. Phys. Lett. 72, 1703 (1998).

U.S. Appl. No. 10/329,981, filed Dec. 27, 2002, D'Evelyn.

U.S. Appl. No. 60/435,189, filed Dec. 18, 2002, D'Evelyn.

* cited by examiner

Increasing Time →

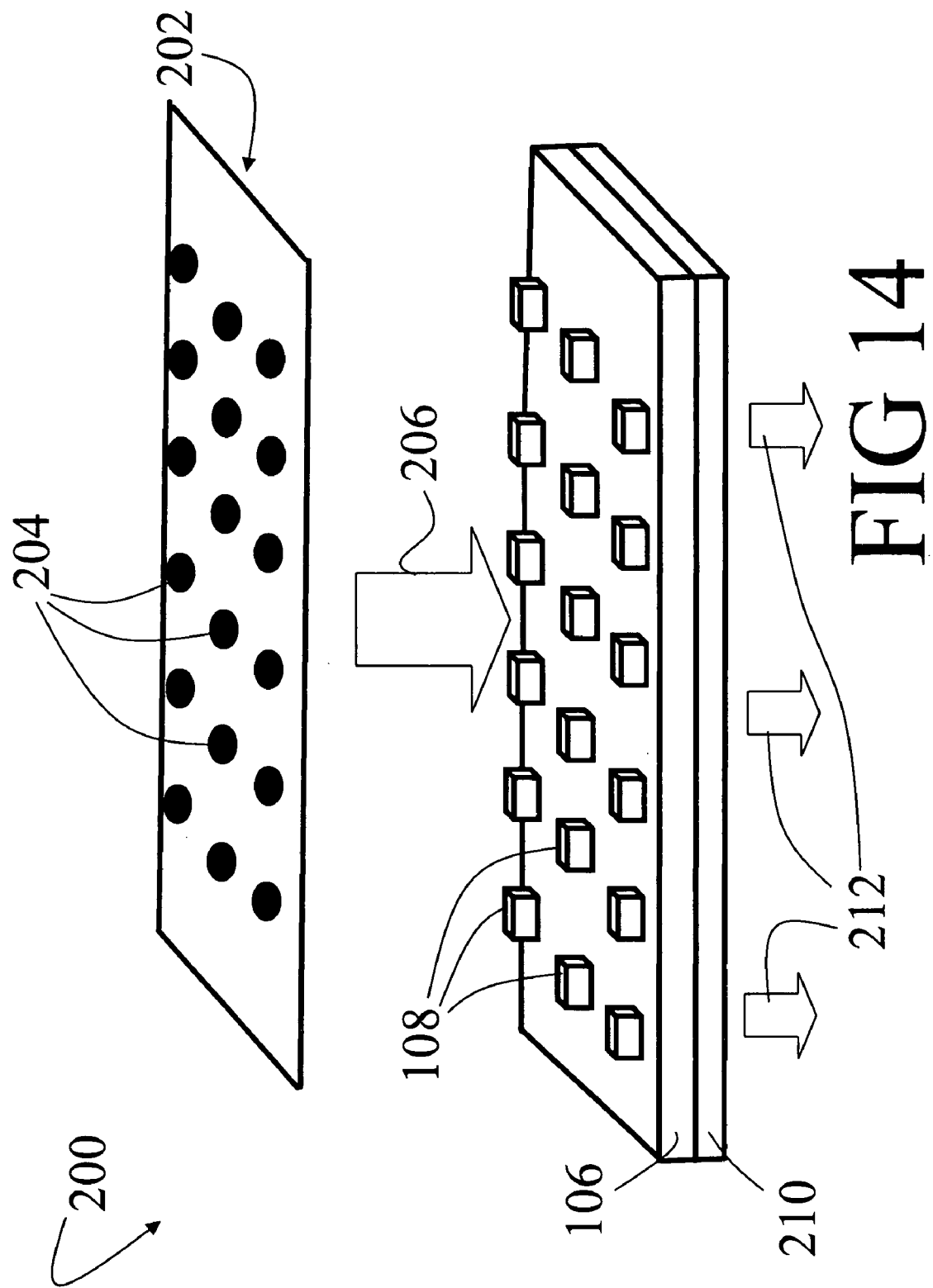

GROUP III-NITRIDE BASED RESONANT CAVITY LIGHT EMITTING DEVICES FABRICATED ON SINGLE CRYSTAL GALLIUM NITRIDE SUBSTRATES

BACKGROUND

The present invention relates to the lighting arts. It especially relates to resonant cavity light emitting devices such as resonant cavity light emitting diodes (RCLED's) and vertical cavity surface emitting lasers (VCSEL's), and will be described with particular reference thereto. However, the invention will also find application in conjunction with other group III-nitride based light sources.

One of the major challenges with solid state lighting at present is efficient extraction of light from the light emitting diode. Another challenge is that light emitting diodes typically emit only one wavelength, whereas for many applications at least one additional wavelength or white light would be desirable. The use of phosphors, typically in a polymer matrix, allows generation of additional wavelengths and/or white light, but often entails loss of efficiency by Stokes shifts, reflective or light-scattering losses, and device failures associated with the phosphor packaging. Resonant cavity devices offer a way to provide more efficient light extraction, but it has so far been difficult to fabricate reliable resonant cavity devices in the group III-nitride material system.

Those skilled in the art recognize substantial advantages of growing group III-nitride light emitting devices on a large-area gallium nitride wafer. Advantages of the gallium nitride substrate material typically include: (i) a close lattice match which, neglecting dopant effects, is essentially perfect for gallium nitride device layers; (ii) reduced strain and dislocation formation in the epitaxial group III-nitride layers as a consequence of the close lattice match; (iii) chemically abrupt interfaces without problematic interdiffusion; (iv) substantial elimination of anti-phase boundaries; and (v) thermal matching that promotes thermal stability during cooldown from high epitaxial growth temperatures and during high temperature device processing. These advantages are particularly significant for large area devices and large-area epitaxial wafers, where lattice mismatch strain or thermal stresses can lead to wafer bowing or breakage.

Advantages of growing on a large area gallium nitride wafer, as opposed to a small area gallium nitride substrate, typically include: (i) economy of scale (more devices per wafer); (ii) easier handling; (iii) easier automated machine manipulation; and (iv) the ability to fabricate large-area devices. The latter advantage is particularly useful for light emitting devices. In many illumination applications, for example, light emitting devices are preferably large compared with typical microelectronic devices. Resonant cavity light emitting diodes for illumination applications, for example, preferably are of order hundreds of microns on a side or larger, corresponding to device areas in the tens of thousands of square microns or higher. These device areas place a lower limit on the feasible size of the substrate.

In spite of these well-known advantages, commercial group III-nitride light emitting devices generally continue to be grown heteroepitaxially on sapphire or silicon carbide substrates due to a lack of high quality large-area gallium nitride substrates. The chemical passivity of nitrogen, a high melting temperature of gallium nitride, and other factors have heretofore made growth of large volume and high quality gallium nitride boules problematic.

U.S. Pat. Nos. 5,637,531 and 6,273,948 disclose methods for growing gallium nitride crystals at high pressure and high temperature, using liquid gallium and gallium-based alloys as a solvent and a high pressure of nitrogen above the melt to maintain GaN as a thermodynamically-stable phase. The process is capable of growing electrically-conductive GaN crystals with a dislocation density of about $10^3$–$10^5$ cm$^{-2}$ or, alternatively, semi-insulating GaN crystals with a dislocation density of about 10–$10^4$ cm$^{-2}$, as described by Porowski, "Near defect-free GaN substrates" [MRS Internet J. Nitride Semicond. Research 4S1, G1.3 (1999)]. However, the conductive crystals have a high n-type background doping on the order of $5 \times 10^{19}$ cm$^{-3}$, believed to be due to oxygen impurities and nitrogen vacancies. The high n-type background causes substantial crystal opacity, for example optical absorption coefficients of around 200 cm$^{-1}$ in the visible range, which is problematic for flip-chip light emitters, and causes the lattice constant to increase by about 0.01–0.02%, generating strain in epitaxial GaN layers deposited thereupon. The undoped GaN substrates formed by this method have a rather limited carrier mobility, about 30–90 cm$^2$/V-s, which may be problematic in high-power devices.

Another technology for growth of pseudo-bulk or bulk GaN is hydride/halide vapor phase epitaxy, also known as HVPE. In one approach, HCl reacts with liquid Ga to form vapor-phase GaCl, which is transported to a substrate where it reacts with injected NH$_3$ to form GaN. Typically the deposition is performed on a non-GaN substrate such as sapphire, silicon, gallium arsenide, or LiGaO$_2$. The dislocation density in HVPE-grown films is initially quite high, on the order of $10^{10}$ cm$^{-2}$ as is typical for heteroepitaxy of GaN, but drops to a value of about $10^7$ cm$^{-2}$ after a thickness of 100–300 µm of GaN has been grown. Heteroepitaxial growth of thick HVPE GaN results in strain-induced bowing during cooldown after growth, which remains even after removal of the original substrate.

In view of the substantial difficulty in producing large gallium nitride boules, some efforts have been directed toward developing complex techniques such as epitaxial lateral overgrowth (ELO) for producing individual gallium nitride substrates. In ELO, an epitaxy-inhibiting mask is deposited over a nucleation substrate such as a sapphire wafer. The mask is lithographically processed to define openings. Gallium nitride growth nucleates in and fills the openings, and then grows laterally over the masked areas in a lateral overgrowth mode. ELO material has been shown to have suppressed dislocation densities. Optionally, the nucleation substrate is removed and the ELO growth process is repeated on the free-standing gallium nitride wafer. Some reports claim dislocation densities as low as $10^4$ cm$^{-2}$ obtained by ELO.

However, much higher dislocation densities remain above the openings where ELO growth initiates. Moreover, coalescence of lateral overgrowth from adjacent openings produce tilt boundaries that typically manifest in thick layers as arrays of edge dislocations. Repeated application of epitaxial lateral overgrowth is not expected to substantially suppress the tilt boundaries. Thus, epitaxial lateral overgrowth is not upwardly scalable in the lateral wafer dimension, and usable growth dimensions are limited to about the order of the spacings of the nucleation openings. Furthermore, ELO does not produce a three-dimensional single-crystal boule, and the processing involved in producing each ELO gallium nitride wafer is labor-intensive, making automation of the ELO wafer formation process difficult.

Doping of GaN by rare earth metals is known to produce luminescence. For example, Lozykowski et al. (U.S. Pat. No. 6,140,669) disclose incorporating rare earth ions into GaN layers by ion implantation, MOCVD, or MBE, and annealing at 1000° C. or greater. Birkhahn et al. (U.S. Pat. No. 6,255,669) disclose fabrication of light-emitting diodes using GaN layers doped with a rare earth ion or with chromium. However, these references focus on thin GaN epitaxial layers rather than bulk crystals and do not relate to resonant cavity devices.

Mueller-Mach et al. (WO 01/24285 A1) disclose the fabrication of GaN-based light-emitting diodes on a single crystal phosphor substrate, preferably, rare-earth-doped yttrium aluminum garnet. DenBaars et al. (WO 01/37351 A1) disclose the fabrication of GaN-based light-emitting diode structures, including a vertical laser structure, on a substrate doped with chromium or other transition or rare earth ions. However, the disclosed laser structure employs only a single cavity and has no capability for directional emission of two or more visible wavelengths of light or of white light.

The present invention contemplates an improved apparatus and method that overcomes the above-mentioned limitations and others.

BRIEF SUMMARY

According to one aspect, a method is provided for producing a resonant cavity light emitting device. A seed gallium nitride crystal and a source material are arranged in a nitrogen-containing superheated fluid that provides a medium for mass transport of gallium nitride precursors between the seed gallium nitride crystal and the source material. A surface of the seed gallium nitride crystal is prepared. The preparing includes applying a first thermal profile between the seed gallium nitride crystal and the source material while the seed gallium nitride crystal and the source material are arranged in the nitrogen-containing superheated fluid. Gallium nitride material is grown on the prepared surface of the seed gallium nitride crystal. The growing includes applying a second thermal profile which is different from the first thermal profile between the seed gallium nitride crystal and the source material while the seed gallium nitride crystal and the source material are arranged in the nitrogen-containing superheated fluid. Said growing produces a single-crystal gallium nitride substrate. A stack of group III-nitride layers are deposited on the single-crystal gallium nitride substrate. The stack includes a first mirror sub-stack and an active region adapted for fabrication into one or more resonant cavity light emitting devices.

According to another aspect, a resonant cavity light emitting device is disclosed. A stack of group III-nitride layers is substantially free of tilt-boundaries and has a dislocation density less than $10^4$ cm$^{-2}$. The stack of group III-nitride layers includes a first mirror sub-stack defining a distributed Bragg reflector and an active region adapted for fabrication into one or more resonant cavity light emitting devices. A mirror cooperates with the first mirror sub-stack to define a resonant cavity inside of which the active region is disposed.

According to another aspect, a resonant cavity light emitting device is disclosed. A stack of group III nitride layers includes an active region. A single crystal gallium nitride substrate on which the stack of group III nitride layers is disposed is substantially free of tilt boundaries. The single crystal gallium nitride substrate has a dislocation density less than $10^4$ cm$^{-2}$. First and second mirrors define a resonant cavity inside of which the active region is disposed. Light produced by the active region resonates in the resonant cavity.

According to yet another aspect, a resonant cavity light emitting device is disclosed. A single-crystal gallium nitride substrate has a characteristic absorption peak at about 3175 cm$^{-1}$ with an absorbance per unit thickness greater than about 0.01 cm$^{-1}$. A stack of group III-nitride layers is disposed on the single-crystal gallium nitride substrate. The stack includes a first mirror sub-stack and an active region. A mirror cooperates with the first mirror sub-stack to define a resonant cavity inside of which the active region is disposed.

According to still yet another aspect, a method is provided for producing a resonant cavity light emitting device. A seed gallium nitride crystal and a source material are arranged in a nitrogen-containing superheated fluid disposed in a sealed container disposed in a multiple-zone furnace. Gallium nitride material is grown on the seed gallium nitride crystal by mass transport from the source material to the seed gallium nitride crystal through the nitrogen-containing superheated fluid. Said growing produces a single-crystal gallium nitride substrate secured to the seed gallium nitride crystal. Said growing includes applying a temporally varying thermal gradient between the seed gallium nitride crystal and the source material to produce an increasing growth rate during at least a portion of the growing. A stack of group III-nitride layers is deposited on the single-crystal gallium nitride substrate. The stack includes a first mirror sub-stack and an active region adapted for fabrication into one or more resonant cavity light emitting devices.

Numerous advantages and benefits of the present invention will become apparent to those of ordinary skill in the art upon reading and understanding the present specification.

BRIEF DESCRIPTION OF THE DRAWINGS

The invention may take form in various components and arrangements of components, and in various process operations and arrangements of process operations. The drawings are only for purposes of illustrating preferred embodiments and are not to be construed as limiting the invention. In the drawings of the resonant cavity light emitting devices, layer thicknesses and lateral dimensions are not drawn to scale.

FIG. 14 shows a light emitting array component including the plurality of resonant cavity light emitting devices fabricated on the low dislocation density single crystal gallium nitride wafer of FIG. 6A.

DETAILED DESCRIPTION OF PREFERRED EMBODIMENTS

Figure 1:
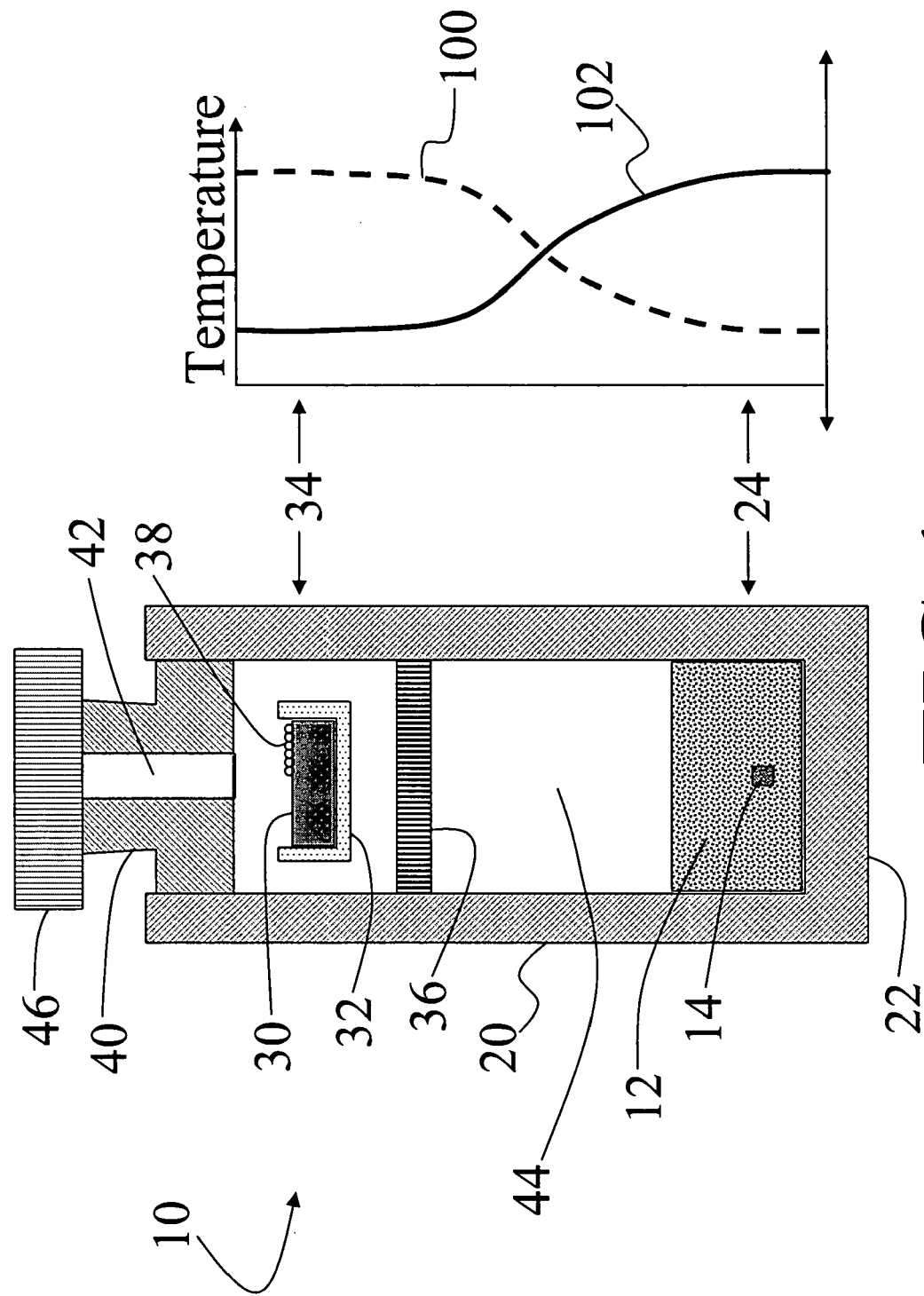
FIG. 1 shows a cross-sectional view of a capsule for use in growing a low dislocation density single crystal gallium nitride substrate boule that is substantially free of tilt boundaries.

With reference to FIG. 1, a cell or capsule 10 is used in growing a three-dimensional gallium nitride boule 12 from a gallium nitride seed 14 using a recrystallization technique performed in a nitrogen-containing superheated fluid. The capsule 10 includes a main container 20 which is preferably generally cylindrical in shape with a diameter of about one inch or larger, although containers having other shapes and sizes are also contemplated. The container 20 includes a sealed bottom section 22, which is preferably integrally formed with the main container 20, although a separately formed bottom section that is welded or otherwise secured to the main container is also contemplated.

The container 20 including the bottom section 22 is preferably formed of at least one of copper, a copper-based alloy, gold, silver, palladium, platinum, iridium, ruthenium, rhodium, osmium, titanium, vanadium, chromium, iron, an iron-based alloy, nickel, a nickel-based alloy, zirconium, niobium, molybdenum, tantalum, tungsten, rhenium, combinations thereof, and the like. In another embodiment, the container 20 including the bottom section 22 is formed from a cold-weldable material such as copper, a copper-based alloy, gold, silver, palladium, platinum, iridium, ruthenium, rhodium, osmium, iron, an iron-based alloy such as a stainless steel, nickel, a nickel-based alloy such as inconel or hastelloy, molybdenum, combinations thereof, and the like. The container 20 including the bottom section 22 is formed of a material that is sufficiently deformable to allow expansion of the capsule 10 as a pressure inside the capsule 10 increases to a few kbar or higher. The container 20 including the bottom section 22 is also preferably impermeable to hydrogen, oxygen, and nitrogen. In one preferred embodiment, the container 20 including the bottom section 22 is made of silver.

The gallium nitride seed 14 is preferably larger than 0.1 cm on a side, is preferably free of tilt boundaries, and has a relatively low dislocation density of preferably less than about $10^8$ cm$^{-2}$, and more preferably less than about $10^5$ cm$^{-2}$. The gallium nitride seed 14 can be obtained from various sources, such as from a heteroepitaxial gallium nitride layer grown on a sapphire or silicon carbide substrate, or from a free-standing gallium nitride film grown by hydride vapor phase epitaxy, sublimation, metalorganic chemical vapor deposition, or the like. Alternatively, the gallium nitride seed 14 can be acquired from gallium nitride material previously grown by the recrystallization technique described herein. The gallium nitride seed 14 is arranged at or near a recrystallization end 24 of the capsule 10. The gallium nitride seed 14 can be secured to an inside surface of the bottom section 22 or to an inside surface of the container 20 by a wire (not shown) or other fastener.

In a preferred embodiment, the gallium nitride seed crystals have a dislocation density below $10^4$ cm$^{-2}$ and are substantially free of tilt boundaries (also known as low-angle grain boundaries), resulting in gallium nitride crystals that similarly have a dislocation density below about $10^4$ cm$^{-2}$ and are substantially free of tilt boundaries. In another embodiment, the gallium nitride seed crystals contain one or more tilt boundaries. Gallium nitride crystals grown by hydride vapor phase epitaxy may be employed as seed crystals, providing a convenient path to large-area seed crystals. However, GaN crystals grown by HVPE typically have a dislocation density in the range of $10^{5-108}$ cm$^{-2}$. In addition, heteroepitaxy produces mosaic structures, and as the thickness of the heteroepitaxial film increases, for example, above 1 mm, the presence of tilt boundaries in the thick film becomes increasingly apparent. In the case of a bulk GaN crystal grown according to the superheated fluid-mediated transport methods described herein on a seed with tilt boundaries, the tilt boundaries in the seed crystal typically will propagate into the growing crystal.

Source material 30 is secured by a permeable basket 32 or other fastener at or near a source end 34 of the capsule 10. The source material 30 may be single-crystal or polycrystalline gallium nitride, amorphous gallium nitride, a gallium nitride precursor such as gallium or a gallium compound, or the like. Preferably, the source material 30 is made up of particles that are too large to pass through openings of an optional baffle 36 that separates the source end 34 from the recrystallization end 24. The openings of the baffle 36 allow passage of gallium nitride precursor material dissolved into a superheated fluid, but do not allow passage of larger solid particles. (If the source material 30 is non-contaminating, or if the capsule 10 is arranged such that direct contamination of the recrystallizing gallium nitride by the source material 30 is substantially suppressed, then the optional baffle 36 is suitably omitted.)

A mineralizer 38 is preferably added to the capsule 10 in order to increase solubility of gallium nitride in the solvent. The mineralizer can be added together with the source material 30, or added separately. Suitable mineralizers include alkali or alkaline-earth nitrides such as $Li_3N$, $Mg_3N_2$, or $Ca_3N_2$, amides such as $LiNH_2$, $NaNH_2$, or $KNH_2$, urea or related compounds, ammonium salts such as $NH_4F$ or $NH_4Cl$, halide, sulfide, or nitrate salts such as NaCl, $Li_2S$, or $KNO_3$, azide salts such as $NaN_3$, other lithium salts, compounds of the aforementioned substances with gallium or with gallium nitride, or the like. In a preferred embodiment, the mineralizer 38 is ammonium fluoride (NH$_4$F). Another preferred mineralizer is ammonium chloride (NH$_4$Cl); however, this mineralizer is more corrosive than ammonium fluoride, and is expected to adversely interact with silver, which is a preferred material for the container 20 of the capsule 10.

Optionally, a dopant source (not shown) is also added to the capsule 10, such as silicon for producing n-type gallium nitride, or magnesium or zinc for producing p-type gallium nitride, or compounds thereof. Added dopants can be used to provide n-type, semi-insulating, p-type, magnetic, or luminescent GaN crystals. Adventitious impurities such as oxygen or carbon will otherwise typically render the crystals n-type. N-type dopants such as O, Si, or Ge, or p-type dopants such as Be, Mg or Zn are suitably added as impurities in the source GaN to produce n-type or p-type doping, respectively. Alternatively, dopants may be added as metals, salts, or inorganic compounds, such as Si, Si$_3$N$_4$, SiCl$_4$, BeF$_2$, Mg$_3$N$_2$, MgF$_2$, Zn, ZnF$_2$, or Zn$_3$N$_2$. GaN crystals with total impurity concentrations below about $10^{15}$–$10^{16}$ cm$^{-3}$ are expected to be semi-insulating. Typically, however, the concentration of unintentional impurities is higher than $10^{16}$ cm$^{-3}$ and the crystals are n-type. Semi-insulating or magnetic GaN crystals may be obtained by doping with certain transition metals such as iron or manganese. Luminescent GaN crystals may be obtained by doping with certain transition or rare-earth metals such as Ti, V, Cr, Mn, Fe, Co, Pr, Eu, Er, or Tm. The transition-metal or rare-earth-metal dopant may be added as impurities in the source GaN or as metals, salts, or inorganic compounds alone or in combination with one or more additional dopants such as O, Si, Mg, Zn, C, or H.

In one embodiment, in order to keep the concentration of undesired dopants, such as oxygen, to an acceptable level, the impurity levels in the raw materials (source gallium nitride, mineralizer, and solvent) and capsules are kept limited to appropriately low levels. For example, an oxygen concentration in the grown crystals below 3×10$^{18}$ cm$^{-3}$ may be achieved by holding the total oxygen content in the raw materials and capsule below about 15 parts per million, expressed with respect to the weight of the final crystal, and an impurity level below 3×10$^{17}$ cm$^{-3}$ may be achieved by holding the total oxygen content in the raw materials and capsule below about 1.5 parts per million.

With continuing reference to FIG. 1, the source end 34 is sealed off by a lid 40 that includes an integral fill tube 42. The lid 40 is suitably made of a material such as one of the materials indicated as being suitable for the container 20, although it will be appreciated that the lid 40 can be made of a different material from the container 20. An airtight seal between the lid 40 and the container 20 is effected by a pipe thread seal, a metal-to-metal compression fit, a gasket seal, or, more preferably, by welding.

After loading the gallium nitride seed 14, inserting the optional baffle 36, and loading the source material 30 and the mineralizer 38, the lid 40 is secured into the source end 34 to make an airtight seal, and the fill tube 42 is connected to a gas manifold (not shown) through which the capsule 10 is evacuated and back-filled with a suitable mass transport medium 44 such as ammonia, hydrazine, methylamine, ethylenediamine, melamine, or another nitrogen-containing fluid that can be brought to a superheated fluid condition by suitable temperature and pressure control. The backfilled fluid is preferably in a condensed state during backfilling, and preferably occupies between 25% and 100% of the free volume of the capsule 10. In one preferred embodiment, between 70% and 95% of the free volume of the capsule 10 is back-filled with ammonia by condensation induced by cooling of the capsule 10 or by injection.

Note that FIG. 1 shows the capsule 10 at a point in time during the recrystallization gallium nitride growth process (described infra). Hence, the gallium nitride boule 12 is shown in FIG. 1 as partially formed, and the mass transport medium 44 is shown in the superheated fluid state. In the superheated fluid state, the superheated fluid transport medium 44 substantially fully occupies the free volume of the capsule 10.

After evacuation and back-filling, the fill tube 42 of the capsule 10 is sealed off by a valve cap 46. Rather than employing the valve cap 46, the fill tube 42 can be pinched off to form a weld, or another suitable sealing approach can be employed.

The described capsule 10 is exemplary only. Other suitable capsules, and methods for filling and sealing such capsules, are described in D'Evelyn et al., U.S. published application 2003/0141301 A1, corresponding to U.S. patent application Ser. No. 09/683,659.

Figure 2:
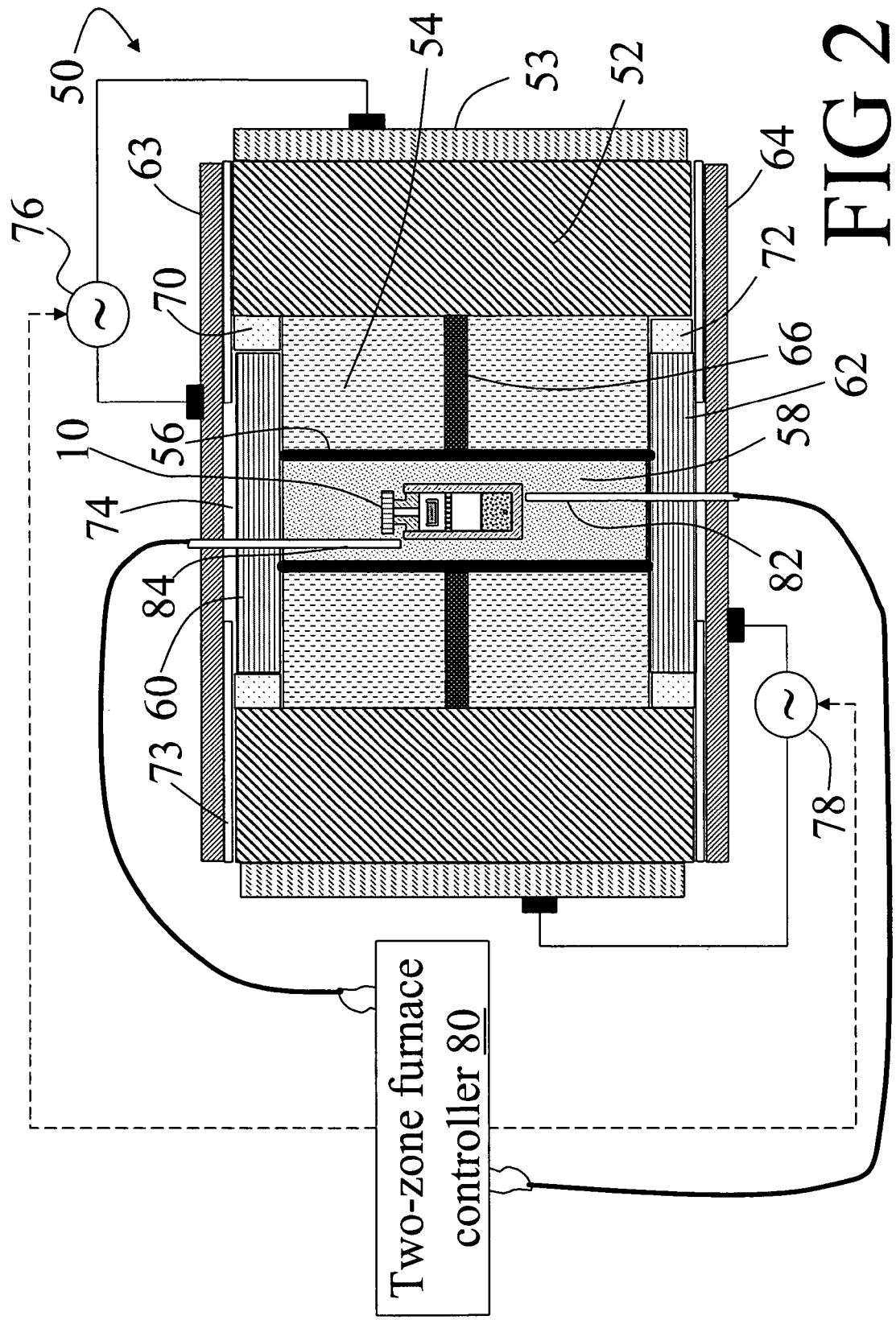
FIG. 2 shows a cross-sectional view of a pressure vessel including a two-zone furnace for use in conjunction with the capsule of FIG. 1 in growing a low dislocation density single crystal gallium nitride substrate boule that is substantially free of tilt boundaries.

With continuing reference to FIG. 1 and with further reference to FIG. 2, dissolving of gallium nitride precursor material from the source material 30, mass transport of said dissolved precursor material to the gallium nitride seed 14, and gallium nitride growth by recrystallization at the recrystallization end 24 is accomplished by controlled application of temperature and pressure in a multiple-heater zone pressure vessel 50 into which the capsule 10 is loaded. The pressure vessel 50 includes a generally annular supporting band 52, such as a tungsten carbide die supported by one or more reinforcing steel bands 53, inside of which is disposed a generally annular liner 54 of sodium chloride salt or another substantially thermally and electrically insulating material.

A generally cylindrical heater tube 56 is disposed inside the generally annular liner 54. The heater tube 56 is suitably made of GRAFOIL®, graphite foil, graphite, a NICHROME alloy (such as 60% nickel, 25% iron, and 15% chromium), niobium, titanium, tantalum, stainless steel, nickel, chromium, zirconium, molybdenum, tungsten, rhenium, hafnium, platinum, silicon carbide, combinations thereof, or the like. Inside the annular liner 54 and the cylindrical heater tube 56 the capsule 10 is disposed, surrounded by a pressure transmission medium 58 such as sodium chloride salt. Endcaps 60, 62 of steel or another hard electrically conductive material close off ends of the cylindrical volume containing the pressure transmission medium 58 and the capsule 10 and electrically contact ends of the heater tube 56. Upper and lower anvils 63, 64 hold endcaps 60, 62 in fixed position respective to the generally annular supporting band 52 and the annular liner 54 to define a substantially fixed volume inside of which is disposed the pressure transmission medium 58 and the capsule 10.

A generally disk-shaped electrically conductive annulus 66 is disposed at a selected position intermediate between the endcaps 60, 62, and electrically contacts the cylindrical heater tube 56 and the generally annular supporting band 52. The conductive annulus 66 is also preferably formed of one of the materials indicated as being suitable for the heater tube 56. However, it will be appreciated that the heater tube 56 and the conductive annulus 58 may be made of different materials. The endcap 60 is electrically isolated from the annular supporting band 52 by a generally annular insulative bushing 70, while the endcap 62 is electrically isolated from the annular supporting band 52 by an annular insulative bushing 72. The annular insulative bushings 70, 72 are suitably made of pyrophyllite, although other electrically insulative materials can be employed.

As the annular liner 54 is substantially electrically insulative, it will be recognized that the cylindrical heater tube 56 is electrically contacted at its ends by the endcaps 60, 62 and at the selected intermediate position by the supporting band 52 via the conductive annulus 58. Otherwise, the heater tube 56 is substantially electrically isolated. Preferably, insulative annular disks 73 provide electrical isolation of the anvils 63, 64 from the generally annular supporting band 52. Thermally insulative and electrically conductive disks 74 comprising molybdenum foil, graphite, or the like are disposed inside the annulus of each annular disk 73 to provide electrical contact between top anvil 63 and top endcap 60 and between bottom anvil 64 and bottom endcap 62, respectively.

A two-zone furnace is thus defined. In the illustrated example, a first heater current flows through a first portion of the heater tube 56 lying between the endcap 60 and the conductive annulus 66. The first heater current is impressed by a first electrical power source 76 applied between the endcap 60 (via the anvil 63) and the supporting band 52. A second heater current flows through a second portion of the heater tube 56 lying between the conductive annulus 66 and the endcap 62. The second heater current is impressed by a second electrical power source 78 applied between the supporting band 52 and the endcap 62 (via the anvil 64).

A two-zone furnace controller 80 receives temperature feedback from a first temperature sensor 82 that monitors a temperature near the recrystallization end 24 of the capsule 10 and from a second temperature sensor 84 near the source end 34 of the capsule 10. The temperature sensors 82, 84 are suitably thermocouple sensors, thermistors, optical fibers coupled to optical pyrometers, or the like. The furnace controller 80 controls the electrical power sources 76, 78 to maintain the ends 24, 34 of the capsule 10 at selected temperature values that effect a selected thermal gradient between the gallium nitride seed 14 and the source material 30.

In operation, the two-zone furnace controller 80 controls the electrical power sources 76, 78 to impress currents on the heater tube 56 that heat the capsule 10 to between about 550° C. and 1200° C. The anvils 63, 64, the supporting band 52, the annular liner 54, and the pressure transmission medium 58 of the pressure vessel 50 cooperate to define a substantially fixed volume of the capsule 10 such that as temperatures in the capsule 10 increase the volume of the capsule 10 remains substantially constant, resulting in self-pressurization of the capsule 10 responsive to the heating. The combination of increasing temperature and increasing pressure drives the mass transport medium 44 into a superheated fluid state. The superheated fluid mass transport medium 44 advantageously combines favorable solvent properties that are typical of liquids with rapid convective mass transport properties that are typical of gases. The gallium nitride dissolving properties of the superheated fluid 44 are preferably enhanced by the mineralizer 38. Without limiting the invention to any particular theory of operation, mass transport of gallium nitride precursors from the source material 30 to the gallium nitride seed 14 or the growing gallium nitride boule 12 is also believed to be enhanced by formation of chemical complexes combining the mineralizer 38 or components thereof with gallium nitride precursors.

Depending upon the concentration of the mineralizer 38 dissolved into the superheated fluid solvent 44, under crystal growth conditions the superheated fluid solution can be supercritical or subcritical. For example, ammonia has a critical temperature and pressure of 132° C. and 113 bar, respectively. The corresponding quantities for $NH_4F$ are expected to be similar to the values for $NH_4Cl$, which are about 882° C. and 1635 bar. A solution of $NH_4F$ in ammonia may be expected to have a critical point at a temperature and pressure intermediate between the critical temperatures and pressures of the constituents $NH_4F$ and ammonia. The presence of gallium-containing complexes in the solution will further modify the equation of state and critical point of the superheated fluid.

The two-zone furnace controller 80 controls temperatures at the recrystallization end 24 and the source end 34 of the capsule 10, creating a selected temperature gradient therebetween. Moreover, by selecting the substantially fixed volume defined by relative positioning of the anvils 63, 64 and the supporting band 52 of the pressure vessel 50 and further defined by the amount of mass transport medium 44 back-filled into the capsule 10 (measured, for example, as the percentage of the free volume occupied by the mass transport medium 44 in the condensed state) the pressure inside the capsule 10 at elevated temperature can be selected. Pressure inside the capsule 10 is suitably indirectly monitored by measuring a press force of the anvils 63, 64, by a stroke gauge monitoring motion of the anvils 63, 64, or by another suitable measure.

The described pressure vessel 50 is exemplary only. Other suitable embodiments and methods are described, for example, in D'Evelyn et al., U.S. published application 2003/0140845 A1, corresponding to U.S. patent application Ser. No. 09/683,658.

To effect recrystallization growth of gallium nitride on the gallium nitride seed 14, the source end 34 and the recrystallization end 24 are set to temperatures that cause a temperature gradient across the capsule 10 which results in dissolution of the source material 30 and growth at the recrystallization end 24. Thus, precursor mass transport occurs from the source end 34 to the recrystallization end 24 where it contributes to recrystallization crystal growth of the gallium nitride boule 12.

It has been found that preceding the recrystallization crystal growth by a preparatory stage is useful for achieving low dislocation densities, that is, for achieving dislocation densities below $10^4$ $cm^{-2}$, and more preferably below $10^3$ $cm^{-2}$, and still more preferably below 100 $cm^{-2}$. During the preparatory stage, the rate of deposition on the gallium nitride seed 14 is lower than during the subsequent gallium nitride recrystallization growth stage. In a preferred embodiment, the preparatory stage includes an etching stage in which the recrystallization end 24 and the source end 34 are set to temperatures that produce a temperature gradient that is opposite the temperature gradient during crystal growth. This reversed temperature gradient causes dissolution or etching of the gallium nitride seed 14. While not limiting the invention to any particular theory of operation, it is believed that this etching stage produces a cleaner, more defect-free prepared surface of the gallium nitride seed 14 which in turn leads to lower dislocation densities in the gallium nitride boule 12 formed during gallium nitride recrystallization.

With reference to FIGS. 1 and 2, in one embodiment, during the preparatory stage the two-zone furnace controller 80 controls the electrical power sources 76, 78 to produce a preparatory temperature profile 100 diagrammatically shown in FIG. 1, in which the recrystallization end 24 is at a lower temperature relative to the source end 34, so that a temperature gradient exists therebetween. For the exemplary two-zone heater arrangement of FIG. 2, the temperature profile 100 is suitably achieved by applying relatively more power using the first electrical power supply 76 and relatively less power using the second electrical power supply 78. The temperature gradient of the temperature profile 100 effects etching of the gallium nitride seed 14 in the presence of ammonium fluoride ($NH_4F$) mineralizer 38 to prepare the surface.

After the preparatory stage is completed, the furnace controller 80 adjusts the electrical power sources 76, 78 to produce a gallium nitride growth temperature profile 102 also diagrammatically shown in FIG. 1, in which the source end 34 is at a lower temperature relative to the recrystallization end 24 such that an opposite temperature gradient exists for the nitride growth temperature profile 102 as compared with the etching temperature profile 100. For the exemplary two-zone heater arrangement of FIG. 2, the temperature profile 102 is suitably achieved by applying relatively less power using the first electrical power supply 76 and relatively more power using the second electrical power supply 78. The temperature gradient of the temperature profile 102 effects recrystallization growth on the gallium nitride seed 14 in the presence of ammonium fluoride ($NH_4F$) mineralizer 38 to produce the gallium nitride boule 12.

The thermal gradient directions of the temperature profiles 100, 102 are suitable for ammonium fluoride ($NH_4F$) mineralizer. Without limiting the invention to any particular theory of operation, it is believed that fluorine-containing complexes provide mass transport of gallium nitride precursors in the superheated fluid mass transport medium 44, and that these fluorine-containing complexes decompose more efficiently at higher temperatures such that recrystallization growth is promoted at the high temperature end of the temperature gradient. Formation of the complexes is reversible, with an equilibrium constant for formation that decreases with temperature so that formation of free GaN is favored at higher temperature and the effective solubility of GaN decreases with temperature. After ending a crystal growth run using the $NH_4F/NH_3$ chemistry, the capsule is typically found to be filled with white needle-shaped crystals. X-ray diffraction analysis indicates that the crystals comprise $GaF_3(NH_3)_2$ and $(NH_4)_3GaF_6$, whose structures are known from the literature.

For some other mineralizers, such as ammonium chloride ($NH_4Cl$), this effect is reversed. Recrystallization growth typically occurs in the presence of ammonium chloride at the lower temperature end of the temperature gradient. For such chemistries, the thermal gradients of the temperature profiles 100, 102 are suitably reversed or otherwise adjusted.

The pressure vessel 50 with integral two-zone furnace shown in FIG. 2 is exemplary only. Those skilled in the art can readily modify the pressure vessel 50 for specific applications. For example, additional electrically conductive elements similar to the electrically conductive annulus 66 can be disposed in spaced apart fashion between the endcaps 60, 62, with additional electrical power sources similar to the power sources 76, 78 coupled thereto to define a three-zone or higher-zone furnace. Moreover, wires or other electrically conductive elements can be substituted for the illustrated electrically conductive annulus 66. With other minor adaptations, the exemplary pressure vessel 50 with integral two-zone furnace can be adapted to a belt apparatus, a piston-cylinder apparatus, a multi-anvil apparatus, a split-sphere apparatus, or other pressure vessel apparatus known in the art.

Figure 4:
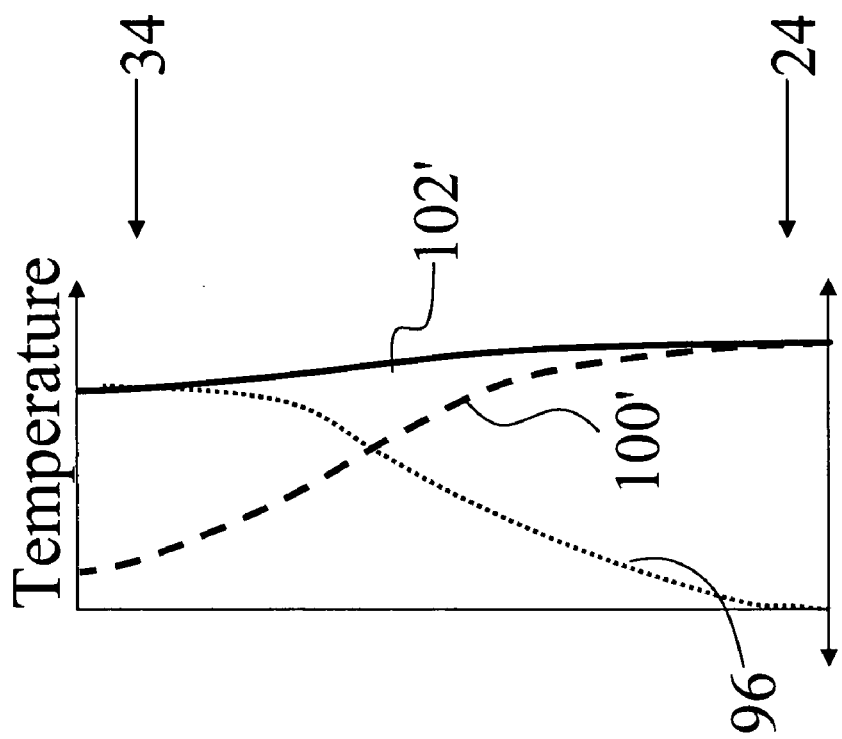
FIG. 4 shows temperature profiles during the preparatory and recrystallization crystal growth phases of the boule formation process when using the alternative furnace configuration of FIG. 3.
Figure 3:
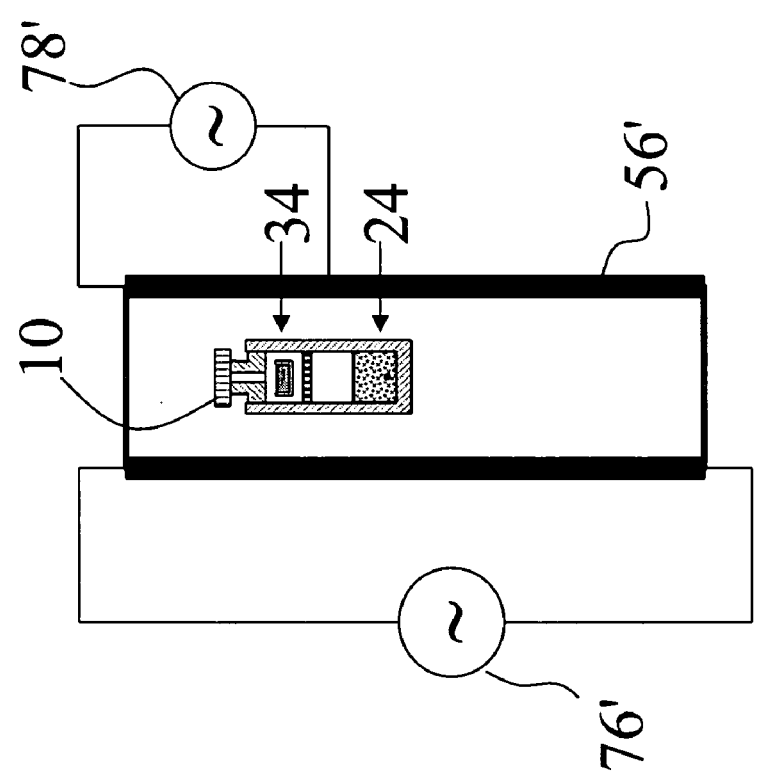
FIG. 3 shows an alternative configuration of the two-zone furnace of the pressure vessel of FIG. 2.

In another variation described with reference to FIGS. 3 and 4, a cylindrical heater tube 56' has the capsule 10 is arranged near an upper end of the heater tube 56', that is, within a temperature gradient zone near an upper end of the heater tube 56'. An electrical power source 76' is applied across the length of the heater tube 56', for example by applying the electrical power source 76' across the anvils 63, 64. Thus, for example, a temperature profile 100' is obtained by applying power using the electrical power supply 76' without applying power using a second electrical power source 78' that heats an upper end of the heater tube 56'. To raise temperature at the source end 34 to reduce or reverse the temperature gradient, power is applied by the electrical power source 78' to produce a temperature profile contribution 96 that provides additional heat at the source end 34. The temperature profile 102' is the sum of the temperature profile contributions 96, 100'.

To obtain low dislocation density gallium nitride, a low dislocation density seed crystal 14 is preferably used. Gallium nitride crystals with a dislocation density below about $10^4$ $cm^{-2}$ that are substantially free from tilt boundaries may be grown from a seed crystal with tilt boundaries and with a dislocation density of about $10^5$–$10^8$ $cm^{-2}$ using the superheated fluid-mediated growth method as follows.

Figure 5A:
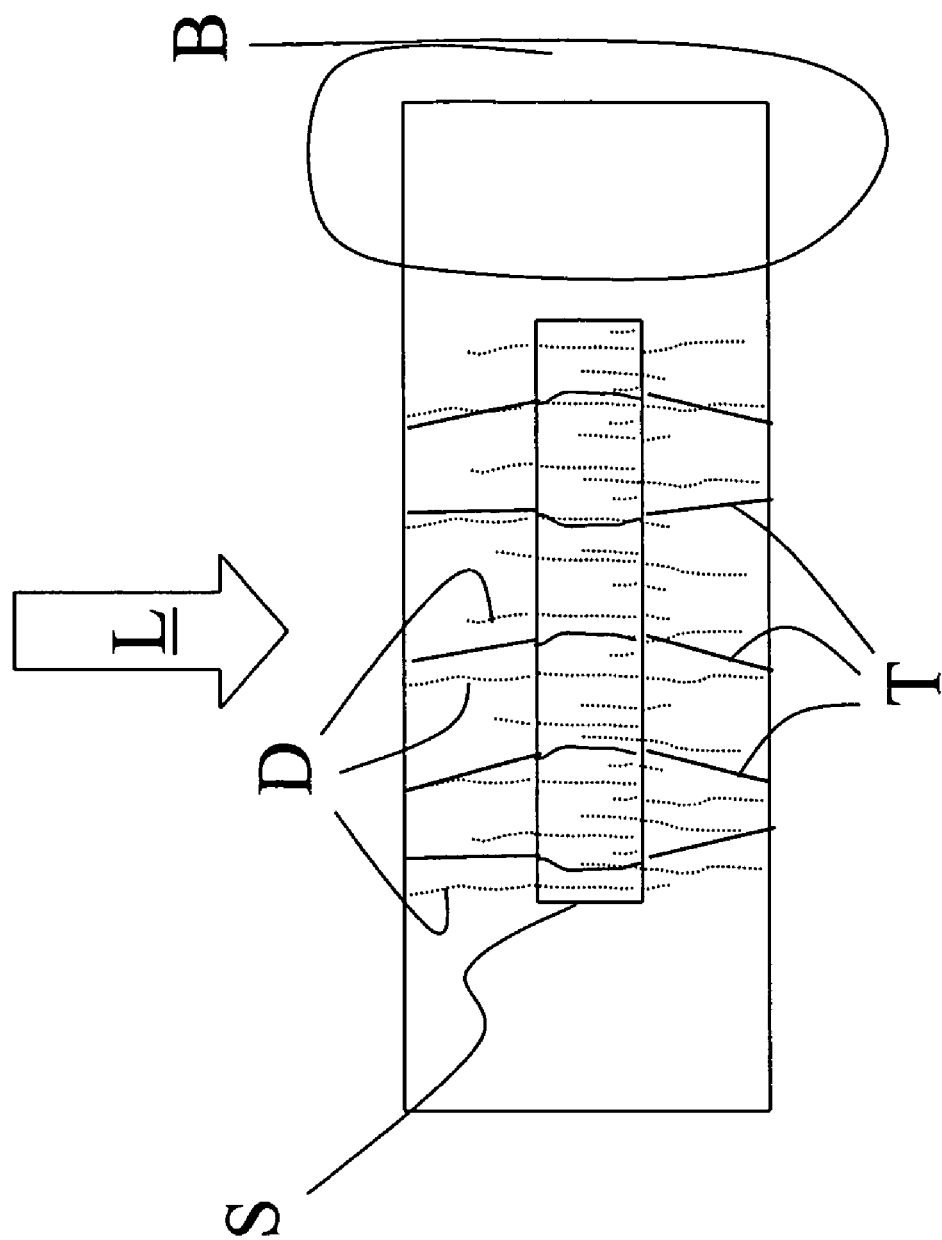
FIG. 5A diagrammatically shows a low defect density seed crystal on which bulk GaN has been grown.
Figure 5B:
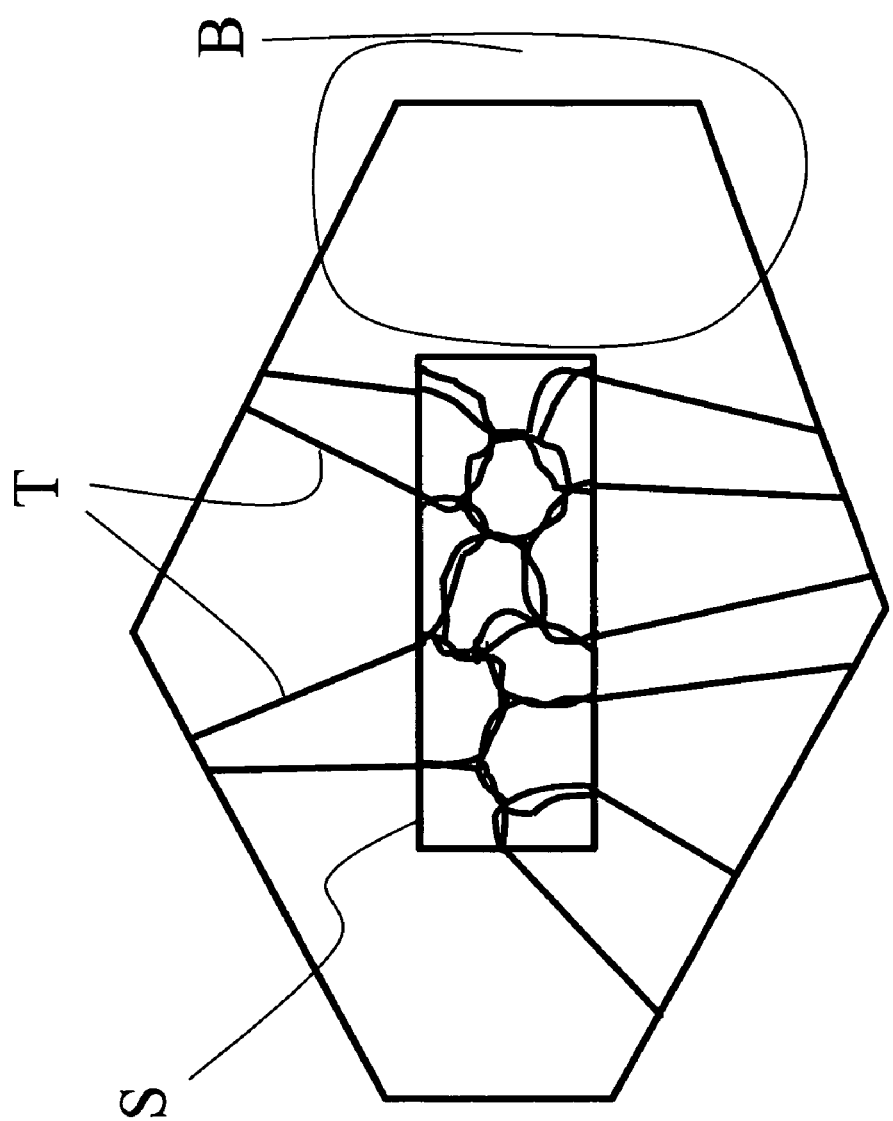
FIG. 5B diagrammatically shows the seed crystal and grown bulk GaN of FIG. 5A viewed along the direction L indicated in FIG. 5A.

With reference to FIGS. 5A and 5B, by suitable control of the solvent fill, mineralizer concentration, temperature, and temperature gradient, growth on the seed will occur in both the c-direction (that is, (0001) and (000$\bar{1}$), along the c-axis) and perpendicular to the c-direction (for example, in the (1$\bar{1}$00) and (11$\bar{2}$0) directions). FIGS. 5A and 5B illustrate growth of GaN material on a seed S. In the diagrammatic view of FIG. 5A, the orientation of the (0001) and (000$\bar{1}$) directions is shown. FIG. 5B diagrammatically illustrates the same crystal with growth of GaN thereon but viewed along the direction L indicated in FIG. 5A. In FIG. 5A, dislocations D are diagrammatically indicated by dotted lines, while tilt boundaries T are diagrammatically indicated by solid lines. Additional dislocations associated with the tilt boundaries are omitted for clarity. In FIG. 5B the dislocations, which are predominantly oriented along the (0001) direction, are omitted.

The dislocation density in bulk GaN grown in the c-direction is reduced significantly. For example, starting with the exemplary rectangular seed S having a dislocation density of about $10^7$ $cm^{-2}$, growth of a 300–800 $\mu m$ thick layer above the c-oriented seed crystal S results in bulk GaN material with approximately 1–3×$10^6$ dislocations $cm^{-2}$ in the region above the seed in the (0001) direction. However, exemplary bulk GaN region B grown laterally with respect to a c-oriented seed crystal has fewer than $10^4$ dislocations $cm^{-2}$, preferably fewer than $10^3$ dislocations $cm^{-2}$, and even more preferably fewer than 100 dislocations $cm^{-2}$. Because dislocations are predominantly (0001) oriented, they substantially do not propagate into the laterally grown material such as into the bulk GaN region B.

Similarly, tilt boundaries T present in the c-oriented seed crystal S will propagate during growth in the c direction, resulting in a grain structure in bulk GaN grown above the seed S that is similar to that in the seed. Tilt boundaries will also radiate outwardly into the bulk GaN that is grown laterally, resulting in progressively larger domains in the bulk GaN region that are free of tilt boundaries as the crystal becomes larger. For example, the GaN region B is free of tilt boundaries. The position of the tilt boundaries may be determined by a method that is well known in the art, such as x-ray diffraction, x-ray topography, cathodoluminescence, or optical reflection, and a new seed crystal may be cut from the laterally-grown GaN region B that is entirely free of tilt boundaries. Bulk GaN grown from this new seed crystal cut from the region B will be substantially free of tilt boundaries and will have a dislocation density below $10^4$ cm$^{-2}$, preferably below $10^3$ cm$^{-2}$, and even more preferably below 100 cm$^{-2}$.

In one superheated fluid-mediated recrystallization gallium nitride growth run performed using an ammonium fluoride mineralizer, a gallium nitride seed weighing 25.3 mg obtained from a previous superheated fluid-mediated recrystallization gallium nitride growth run was hung through a laser-drilled hole by a 0.13-mm silver wire from a silver baffle with a 35% open area and placed in the recrystallization end of a 0.5 inch diameter capsule container. A 0.10 g amount of ammonium fluoride (NH$_4$F) mineralizer and 0.98 g of polycrystalline gallium nitride source material were placed in the source end of the capsule. The capsule was then enclosed within a filler/sealing assembly together with a 0.583 inch diameter steel ring. The capsule and filler/sealing assembly were transferred to a gas manifold and filled with 1.07 g of ammonia. Next, the plug was inserted into the open top end of the capsule, such that a cold weld was formed between the silver capsule and silver plug and the steel ring surrounded the plug and provided reinforcement. The capsule was then removed from the filler/sealing assembly and inserted in a pressure vessel with integral two-zone furnace that was mechanically similar to the pressure vessel 50 of FIG. 2, and electrically similar to the configuration of the two-zone furnace shown in FIG. 3.

The capsule was heated using the primary heater 76' at about 11° C./min until the temperature of the recrystallization end 24 of the capsule 10 was approximately 700° C. and the temperature of the source end 34 of the capsule 10 was approximately 648° C., as measured by type K thermocouples. The current through the source end 34 was then increased using the heater 78' until the temperature gradient ΔT decreased to 3° C. After holding at ΔT=3° C. for 1 hour, the temperature of the source end of the capsule was decreased at 5° C./hr by reducing power applied by the heater 78' until ΔT increased to approximately 30° C., then decreased further at 2.5° C./hr until ΔT increased to approximately 60° C. and the temperatures were held at these values for 20 hr.

The cell was then cooled and removed from the pressure vessel. Upon opening the capsule after venting of the ammonia, the gallium nitride seed had grown to a weight of 40.2 mg. An etch pit density measurement of dislocation density was then performed by etching the crystal in 50% HNO$_3$ for 30 min. A row of etch pits was observed on the c-face above the interface between the seed and new, laterally-grown material. However, the remaining areas of newly-grown GaN were free of etch pits. The area of pit-free newly grown GaN was approximately 0.069 cm$^2$, indicating that the etch pit density was less than (1/0.069 cm$^2$) or 14 cm$^2$.

The described gallium nitride growth run is exemplary only. Other examples of gallium nitride growth runs are described in D'Evelyn et al., U.S. patent application Ser. No. 10/329,981. The gallium nitride grown by recrystallization including the preparatory etch process and characterized by etch pit density measurements are typically free of etch pits except for a small area formed over the gallium nitride seed and aligned with a c-axis of the gallium nitride seed. These etch pit free areas correspond to an upper limit on dislocation density of typically less than 50 cm$^{-2}$. Similarly low dislocation density values have been determined using cathodoluminescence characterization of the dislocation densities.

Gallium nitride substrates having lateral dimensions as large as about 1.5 cm by 1.8 cm have been produced by the disclosed GaN recrystallization growth method, and the described methods and apparatuses are readily scalable to larger sizes. Preferably, wafers having a minimum lateral dimension of 25–50 mm are produced which is large enough to produce most resonant cavity light emitting devices or arrays of such devices. However, larger wafers are also contemplated.

While a preferred embodiment employs an etch preparatory period followed by recrystallization growth, it is also contemplated to use more complex preparatory periods, such as a cycling between etching and growth two or more times to provide further surface improvement and dissolution of spontaneously-nucleated crystals. That under selected temperature and pressure conditions the preparatory period can be designed to etch gallium nitride has been verified by loading a thin gallium nitride film deposited on sapphire in place of the gallium nitride seed 14. The thin gallium nitride film was found to be totally etched away, demonstrating that etching is occurring. A gradual transition from the etching condition to the recrystallization growth condition is also believed to be beneficial in producing low dislocation densities. Without limiting the invention to any particular theory of operation, it is believed that the gradual transition effects a slow initial recrystallization growth rate that provides additional surface smoothing, surface step restructuring, or the like. Moreover, while preparatory periods that include etching followed by a gradual transition through a slow growth rate have been employed, it is also contemplated to employ a preparatory period that includes a slow initial recrystallization growth rate without an initial etching period, thus relying upon surface smoothing provided by the slow growth rate to improve GaN crystal quality.

It will be appreciated that crystal growth recipes specifying specific temperature setpoints, preparatory process time intervals, and the like, are typically apparatus-specific. For example, the readings of the temperature sensors 82, 84 used for control are indicative of the actual temperatures at the recrystallization and source ends 24, 34 of the capsule 10, but are typically not exact. Temperature differences between the readings of the sensors 82, 84 and the actual temperatures in the capsule 10 can arise due to spatial separation of the sensors 82, 84 from the capsule 10, miscalibration of the sensors 82, 84, emissivity errors in the case of pyrometric temperature sensors, and so forth.

In the exemplary growth run, for example, although the type K thermocouples indicated a positive temperature gradient directed from the source material to the gallium nitride seed during the preparatory stage, it is believed that a reversed thermal gradient was present within the capsule 10 during at least a portion of the preparatory stage. Alternatively or in combination, a slow growth rate effected by a small positive temperature gradient directed from the source material to the gallium nitride seed during the preparatory stage may be responsible for the observed low dislocation density.

Preferably, the transition from the preparatory temperature profile to the gallium nitride growth temperature profile is performed gradually as described in the exemplary growth run, in which the temperature of the source end 34 is gradually increased. The detailed temperature transients introduced during this temperature profile change are also typically apparatus-specific. Those skilled in the art can readily modify the exemplary growth run for specific apparatuses and target gallium nitride characteristics.

The gallium nitride boule 12 typically exhibits significant concentrations of hydrogen. For example, a gallium nitride single crystal formed by the superheated fluid-mediated recrystallization growth process was characterized by infrared transmission spectroscopy and by Raman spectroscopy. In contrast to gallium nitride grown by other methods such as hydride vapor phase epitaxy, the gallium nitride grown by the superheated fluid-mediated recrystallization growth process had several sharp absorption peaks in the range of 3050 to 3300 cm$^{-1}$, with a maximum absorption near 3175 cm$^{-1}$. The crystal was annealed to 750° C. in high purity nitrogen for 30 min and the infrared spectrum was re-measured. The absorption peaks in the range of 3050 to 3300 cm$^{-1}$ were substantially unchanged, indicating a high stability of these species. Without limiting the invention to any particular theory of operation, these absorption peaks in the range of 3050 to 3300 cm$^{-1}$ are believed to be associated with hydrogen complexed with gallium vacancies. In n-type gallium nitride, gallium vacancies act as deep, triple acceptors which compensate donors. Hydrogen can bind to gallium vacancies, capping the dangling bond on between one and four surrounding nitrogen atoms to form N—H bonds, denoted $V_{Ga}H$, $V_{Ga}H_2$, $V_{Ga}H_3$, and $V_{Ga}H_4$, respectively. N—H bonds associated with Ga vacancies are predicted [C. Van de Walle, Phys. Rev. B 56, R10020 (1997)] to have vibration frequencies between 3100 and 3500 cm$^{-1}$ and to be substantially stable.

Based on predictions of vibrational frequencies of 3100–3470 cm$^{-1}$ for $V_{Ga}H_1$—$V_{Ga}H_4$ (which may overestimate the actual frequencies by about 200 cm$^{-1}$) and the observation of infrared absorption features at 3020–3050 cm$^{-1}$ and at 3140 cm$^{-1}$ in hydrogen-implanted gallium nitride [M. G. Weinstein et al., Appl. Phys. Lett. 72, 1703 (1998)], it is believed that the absorption peaks between 3150 and 3200 cm$^{-1}$ observed in the superheated fluid-mediated recrystallization grown gallium nitride correspond to $V_{Ga}H_3$ and $V_{Ga}H_4$. The absorption peaks between 3000 and 3150 cm$^{-1}$ observed in both superheated fluid-mediated recrystallization grown gallium nitride and hydrogen-implanted gallium nitride are believed to correspond to $V_{Ga}H_1$ and $V_{Ga}H_2$.

Thus, the presence of an infrared absorption feature near 3175 cm$^{-1}$ in gallium nitride crystals grown by the superheated fluid-mediated recrystallization method indicates hydrogen passivation of gallium vacancies, and the persistence of the infrared feature upon high temperature annealing indicates that this passivation is relatively stable. Depending on the concentration of hydrogenated gallium vacancies in the GaN crystal, the absorbance per unit thickness of the 3175 cm$^{-1}$ peak will lie between about 0.01 and 200 cm$^{-1}$. Additional evidence for the passivation of point defects in a gallium nitride crystal grown by the superheated fluid-mediated recrystallization growth method was obtained by Raman spectroscopy. A total of five peaks were observed in two configurations between 400 and 800 cm$^{-1}$. The peaks, with the assignments in brackets, were observed at 530 cm$^{-1}$ [$A_1$(TO)], 558 cm$^{-1}$ [$E_1$ (TO)], 569 cm$^{-1}$ [$E_2$ (high)], 734 cm$^{-1}$ [$A_1$ (LO)], and 742 cm$^{-1}$ [$E_1$ (LO)]. These values are all within a few cm$^{-1}$ of accepted values for pure gallium nitride reported in the literature. A broad peak associated with phonon-plasmon coupling was not observed. The observation of unshifted LO modes and the absence of a phonon-plasmon mode indicates a carrier concentration below $10^{17}$ cm$^{-3}$, based on Raman measurements reported in the literature on gallium nitride with carrier concentrations between $10^{16}$ cm$^{-3}$ and $10^{20}$ cm$^{-3}$. The total impurity concentration in this crystal was above $10^{19}$ cm$^{-3}$. The drastic reduction in carrier concentration relative to the impurity concentration indicates a high degree of compensation, most likely due to hydrogen.

Within the visible spectrum, the gallium nitride boule 12 typically exhibits substantial transparency. The optical absorption coefficient for nominally undoped crystals is generally less than 5 cm$^{-1}$ between 465 nm and 700 nm. Doped crystals exhibit similarly low absorption, although some free carrier absorption may be introduced at high carrier concentrations. Moreover, dopants, substitutional or interstitial impurities, vacancy complexes, or other point defects may introduce narrow peaks of higher absorption within the visible range. Such point defect-related narrow absorption peaks typically do not, however, significantly reduce the substantial transparency of the crystal in the visible for purposes such as backside extraction of illumination or other useful light output generated by the resonant cavity light emitting device.

The incorporated hydrogen is believed to be benign or possibly even beneficial. Typical gallium nitride crystal growth methods do not provide passivation of gallium vacancies by hydrogenation, even if hydrogen is in the growth system. For example, infrared transmission spectroscopy on 300–400 μm thick GaN samples grown by hydride vapor phase epitaxy (HVPE) revealed weak absorption features near 2850 and 2915 cm$^{-1}$ associated with another defect, but no absorption features between 3100 and 3500 cm$^{-1}$ that could be assigned to hydrogenated Ga vacancies were observed in the HVPE gallium nitride material.

In the case where gallium nitride boule 12 is grown using at least one of $NH_4F$, $GaF_3$, or other compounds obtainable by reaction of Ga, GaN, $NH_3$, and HF, as mineralizer, a preferred embodiment, the gallium nitride typically contains greater than about 0.04 ppm fluorine, and typically between about 0.04 and 1 ppm fluorine. By contrast, GaN crystals grown with fluorine-free mineralizers typically contain less than 0.02 ppm fluorine. The incorporated fluorine is suitably quantified by glow discharge mass spectrometry, secondary ion mass spectrometry, fusion-dissolution followed by inductively-coupled plasma or fluorine-selective-electrode analysis, or the like. As with the case of incorporated hydrogen, the incorporated fluorine is believed to be benign or possibly even beneficial. Bond lengths to fluorine in molecules or solids are typically only slightly larger than the corresponding bonds to hydrogen, so that fluorine may play a similar role passivating defects.

Figure 6A:
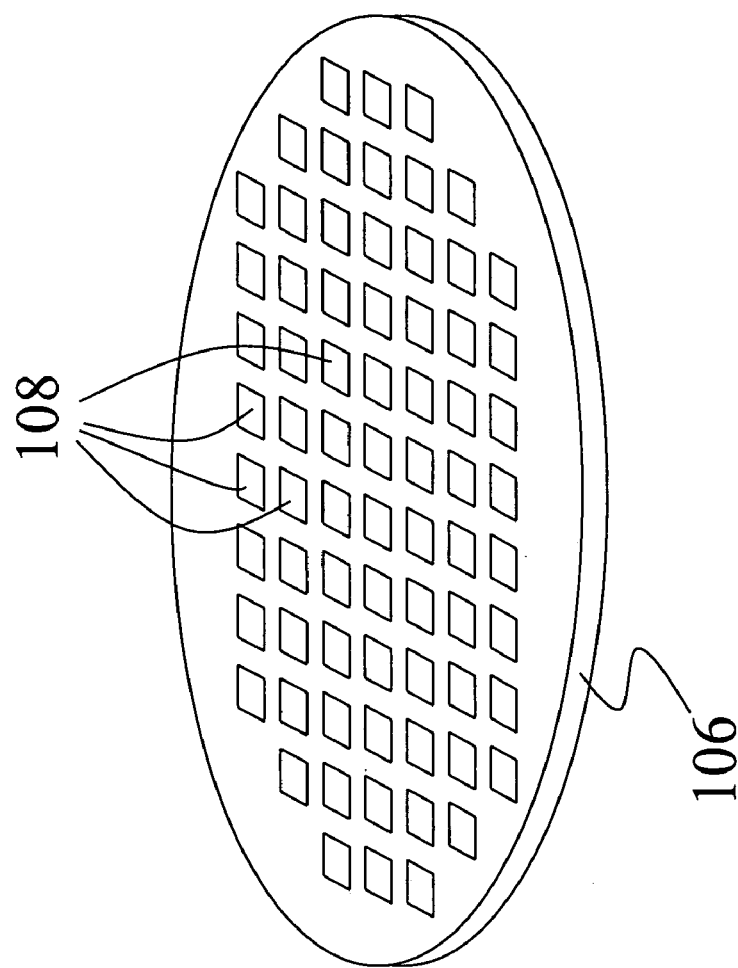
FIG. 6A shows an example gallium nitride wafer sliced from the gallium nitride boule of FIG. 6 with an array of resonant cavity light emitting devices formed thereon.
Figure 6:
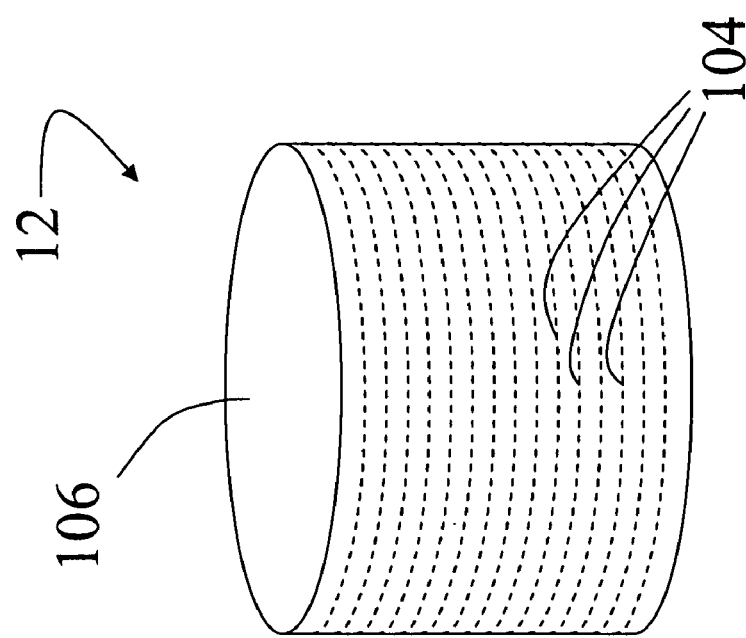
FIG. 6 shows the low dislocation density single crystal gallium nitride boule extracted from the capsule of FIG. 1.

With reference to FIGS. 6 and 6A, the superheated fluid-mediated recrystallization grown gallium nitride boule 12 is preferably sliced (as indicated in FIG. 6 by dashed slice cut lines 104) to produce a plurality of gallium nitride wafers such as exemplary gallium nitride wafer 106. Each wafer 106 preferably has a diameter of at least 0.1 cm, and more preferably has a diameter of between 2.5 cm and 5.0 cm. Larger diameter wafers are also contemplated. Moreover, while a substantially round wafer 106 is shown, otherwise-shaped wafers can also be used.

A selected wafer, such as the wafer 106, is used for epitaxial growth of a stack of group III-nitride layers including a first mirror sub-stack and an active region adapted for fabrication into one or more resonant cavity light emitting devices. Semiconductor device fabrication processing is applied to the stack of group III-nitride layers to define a plurality of devices, such as the exemplary resonant cavity light emitting devices 108 shown in FIG. 6A on the gallium nitride wafer 106. The gallium nitride substrate wafer 106 including portions that extend between the devices 108 do not include tilt boundaries or edge dislocation arrays associated with tilt boundaries. Moreover, the semiconductor layers of the devices 108 are epitaxially grown and mimic the substrate, and thus also have no tilt boundaries and typically have dislocation densities comparable to the dislocation density of the substrate 106. For illumination applications, the devices 108 are preferably relatively large-area devices, for example, devices that are at least 0.05 cm on a side corresponding to device areas of order thousands or tens of thousands of square microns.

Advantageously, the gallium nitride boule 12 can be sliced to provide a selected crystal surface for epitaxial growth of the stack of group III-nitride layers. In preferred embodiments, the epitaxy surface orientation is selected from a group consisting of: (0001), (000$\underline{1}$), (1$\underline{1}$00), and (11$\underline{2}$0), where the underscore indicates a negative value (also indicated in conventional crystal orientation notation using an overbar). It will be appreciated that the (0001) and (000$\underline{1}$) orientations are available on opposite sides of a wafer sliced with the principal surface perpendicular to the [0001] crystal direction. The (0001) surface orientation is typically provided by epitaxial lateral overgrowth and related techniques; however, this surface is a polar surface which can lead to polarization fields at interfaces of group III-nitride layers. In contrast, the (1$\underline{1}$00) surface and the (11$\underline{2}$0) surface are non-polar surfaces that suppress polarization fields at layer interfaces.

Prior to epitaxial deposition, the gallium nitride substrate wafer 106 is preferably mechanically polished to a mirror finish. Subsurface damage on the wafer left over from the polishing process is suitably removed by one or more techniques such as chemically-assisted ion beam etching, reactive ion etching, high ion density plasma etching, wet etching, chemo-mechanical polishing, or the like. Residual damage is optionally also removed by heating the wafer 106 to a temperature between 700° C. and 1500° C. in an atmosphere containing ammonia at a partial pressure of between 0.1 bar and 20 kbar.

The stack of group III-nitride layers is suitably deposited by an epitaxial method such as metalorganic chemical vapor deposition (also known in the art by similar nomenclatures such as organometallic vapor phase epitaxy) or molecular beam epitaxy. Group III-nitride materials for optoelectronic devices typically include binary compounds GaN, AlN, InN, ternary compounds $In_xGa_{1-x}N$, $Al_xGa_{1-x}N$, $In_xAl_{1-x}N$, and quaternary compounds $In_xAl_yGa_{1-x-y}N$ where the indices x and y are in a range between 0 and 1 and for the quaternary alloys the sum (x+y) are in a range between zero and one. The group III element boron can also be incorporated into some of the group III-nitride layers. It is also contemplated to incorporate a small fraction of another group V element besides nitrogen into selected layers, such as phosphorous or arsenic.

Prior to growing the stack of group III-nitride layers, the gallium nitride wafer 106 is preferably prepared in the reactor (for metalorganic chemical vapor deposition) or growth chamber (for molecular beam epitaxy) by heating the wafer 106 to about 900° C. to 1200° C. in an atmosphere containing ammonia at a partial pressure of between $10^{-6}$ mbar and 1 bar. Preferred group III precursors for metalorganic chemical vapor deposition include trimethylgallium, trimethylaluminum, and trimethylindium; however, other group III precursors such as triethylgallium can be employed. For molecular beam epitaxy, elemental gallium, aluminum, and indium are suitably used as group III sources. Optionally, in a gas-source molecular beam epitaxy system organometallics are employed as the group III sources similarly to in metalorganic chemical vapor deposition. Ammonia is preferably used as the nitrogen source, although other nitrogen sources such as hydrazine, a methylhydrazine compound, or the like can be employed. For molecular beam epitaxy a cracker can be used to promote dissociation of the nitrogen precursor, or an atomic nitrogen source can be employed. Dopant sources for metalorganic chemical vapor deposition include silane, disilane, or the like for n-type doping, and bis-(cyclopentadienyl)magnesium, dimethylzinc, or the like for p-type doping. Elemental dopants can be used in molecular beam epitaxy.

Hydrogen is a common impurity in group III-nitride materials, and in the case of a p-type material hydrogen-acceptor complexes can cause high resistivity of the p-type material. Preferably, hydrogen-acceptor complexes are dissociated by annealing at a temperature above 400° C., or hydrogen incorporation can be suppressed by performing the epitaxy in a substantially hydrogen-free environment. In the absence of hydrogen, p-type resistivities are preferably below about $10^5$ ohm-cm.

Because the stack of group III-nitride layers is substantially lattice matched to the gallium nitride substrate 106, the group III-nitride layers typically will have dislocation densities comparable to that of the gallium nitride substrate 106. Thus, for example, the gallium nitride substrate 106 preferably has a dislocation density of less than $10^4$ cm$^{-2}$, and more preferably has a dislocation density of less than $10^3$ cm$^{-2}$, and still more preferably has a dislocation density of less than 100 cm$^{-2}$; the stack of group III-nitride layers correspondingly has a dislocation density of less than $10^4$ cm$^{-2}$, and more preferably has a dislocation density of less than $10^3$ cm$^{-2}$, and still more preferably has a dislocation density of less than 100 cm$^{-2}$. Somewhat higher dislocations may occur in layers containing In and/or Al due to the small lattice mismatch, or in layers grown on top of layers containing In and/or Al due to propagation of dislocations from the In— and/or Al-containing layers. Moreover, the stack of group III-nitride layers has a principal surface with an orientation corresponding to epitaxy surface orientation of the substrate, which is suitably selected from a group consisting of: (0001), (000$\underline{1}$), (1$\underline{1}$00), and (11$\underline{2}$0).

Figure 7:
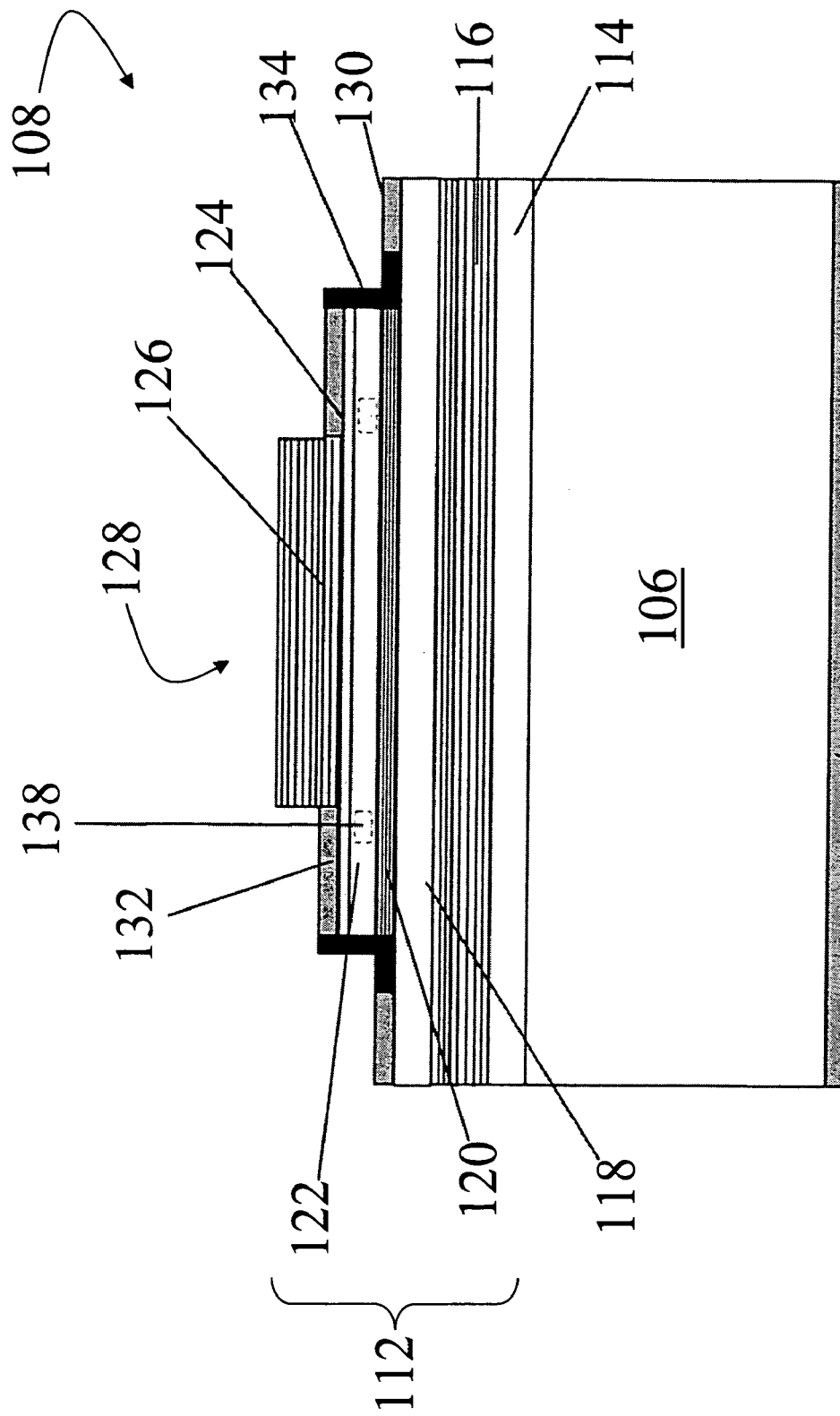
FIG. 7 shows an example resonant cavity light emitting device layer structure suitable for use as a resonant cavity light emitting diode or as a vertical cavity surface emitting laser.

With reference to FIG. 7, one of the resonant cavity light emitting devices 108 of FIG. 6A is described in greater detail. In this exemplary device, the stack of group III-nitride layers 112 grown on the gallium nitride substrate 106 includes in order of epitaxial deposition: an optional n$^+$ GaN layer 114; a first mirror sub-stack 116 defining an n-type AlInGaN distributed Bragg reflector (DBR); an n-type GaAlInN cladding layer 118; an active region 120 including a GaAlInN multiple quantum well structure; a p-type GaAlInN cladding layer 122; a current spreading layer 124; and a second mirror sub-stack 126 defining a p-type AlInGaN distributed Bragg reflector (DBR).

Selected portions of upper epitaxially deposited layers 120, 122, 124, 126 are lithographically removed, optionally along with removal of a portion of the thickness of the n-GaAlInN cladding layer 118, to define a device mesa 128 that includes a portion of the second mirror sub-stack 126 as shown in FIG. 7. The removal of material to define the device mesa 128 forms trenches in the stack of group III-nitride layers 112 that extend from an exposed surface of the stack 112 at least partway toward the single-crystal gallium nitride substrate 106. The trenches define laterally spaced islands of the active region 120. The device mesas 128 include the islands of the active region 120. Because the single-crystal gallium nitride substrate 106 is substantially free of tilt boundaries, portions of the single-crystal gallium nitride substrate 106 that extend between the device mesas 128 contain substantially no edge dislocation arrays such as typically form at low-angle tilt boundaries.

Electrical contact is made by a frontside n-type electrode 130 contacting n-GaAlInN cladding layer 118, and by a frontside p-type electrode 132 contacting the current spreading layer 124. An insulating material 134, for example, $SiO_2$ or $SiN_x$, is preferably disposed between the electrodes 130, 132 to provide enhanced electrical isolation of the electrodes 130, 132 and to provide surface passivation. If the gallium nitride substrate 106 is doped n-type, the frontside n-type electrode 130 can be replaced by a backside n-type electrode 136 contacting the substrate 106. For surface emitting lasers the backside electrode 136 is preferably reflective, for example a Ti/Al metal stack. For a resonant cavity light emitting diode employing backside light emission, the backside electrode 136 is preferably substantially light transmissive, for example including substantially transparent indium tin oxide or a thin light-transmissive layer of metal. More preferably, for backside light emission the frontside n-electrode 130 is employed.

Further device fabrication processing may be performed depending upon the desired operation of the resonant cavity light emitting device 108. For example, to laterally define the optical cavity in a vertical cavity surface emitting laser, ion implanted regions 138 are suitably formed by ion implantation. To define a circular aperture, for example, the ion implanted regions 138 form a circle defining the laser aperture. Similarly, to define a rectangular aperture, the ion implanted regions 138 form a rectangle defining the laser aperture.

The thicknesses and compositions of the various layers of the stack 112 of group III-nitride layers are selected based on the desired wavelength of operation and other operating characteristics. For example, the light emission wavelength of the active region 120 is determined by parameters such as thicknesses and compositions of the quantum wells and barriers. For 340 nm emission, a 2 nm $Al_{0.20}In_{0.04}Ga_{0.76}N$/7 nm $Al_{0.35}In_{0.07}Ga_{0.58}N$ quantum well is suitable. For 460 nm emission, a 3 nm $In_{0.15}Ga_{0.85}N$/6 nm $In_{0.05}Ga_{0.95}N$ quantum well is suitable. The precise compositions and layer thicknesses required to produce emission at a given wavelength may depend on the details of atomic-layer ordering of the AlInGaN material. It is also contemplated to employ a single GaAlInN quantum well active region. Those skilled in the art can select other quantum well structures for light emission in the ultraviolet to blue wavelength range (for example, in a range of about 250 nm to about 500 nm) using literature values for parameters that may impact the emission wavelength, such as for bandgaps of the group III-nitride layers, for electron and hole effective masses, for conduction and valence band offsets at interfaces, and so forth.

The active region 120 can be undoped, p-type, n-type, or a combination thereof. In a preferred embodiment, the quantum wells are undoped while the barrier layers are undoped or doped n-type. Because the lower bandgap quantum well materials such as InN, $In_xGa_{1-x}N$ and the like typically decompose at lower temperatures than does GaN, these layers are preferably deposited at temperatures between about 650° C. and 1050° C.

In one embodiment, growth conditions of the quantum well or wells of the active region 120 are adjusted to promote three-dimensional or islanding growth to produce quantum dots rather than planar quantum well layers. In the metalorganic chemical vapor deposition epitaxial technique, indium-containing group III-nitride quantum dots can be grown by partial atomic layer epitaxy by cycling metallic precursors at selected intervals typically between 1 microsecond and 1 minute, depending upon the growth temperature, such that the binary constituents are deposited separately. Alternatively, the temperature, pressure, or other growth parameters can be adjusted based on solid solubility information obtained from the literature to deposit under conditions that lead to islanding.

Figure 8:
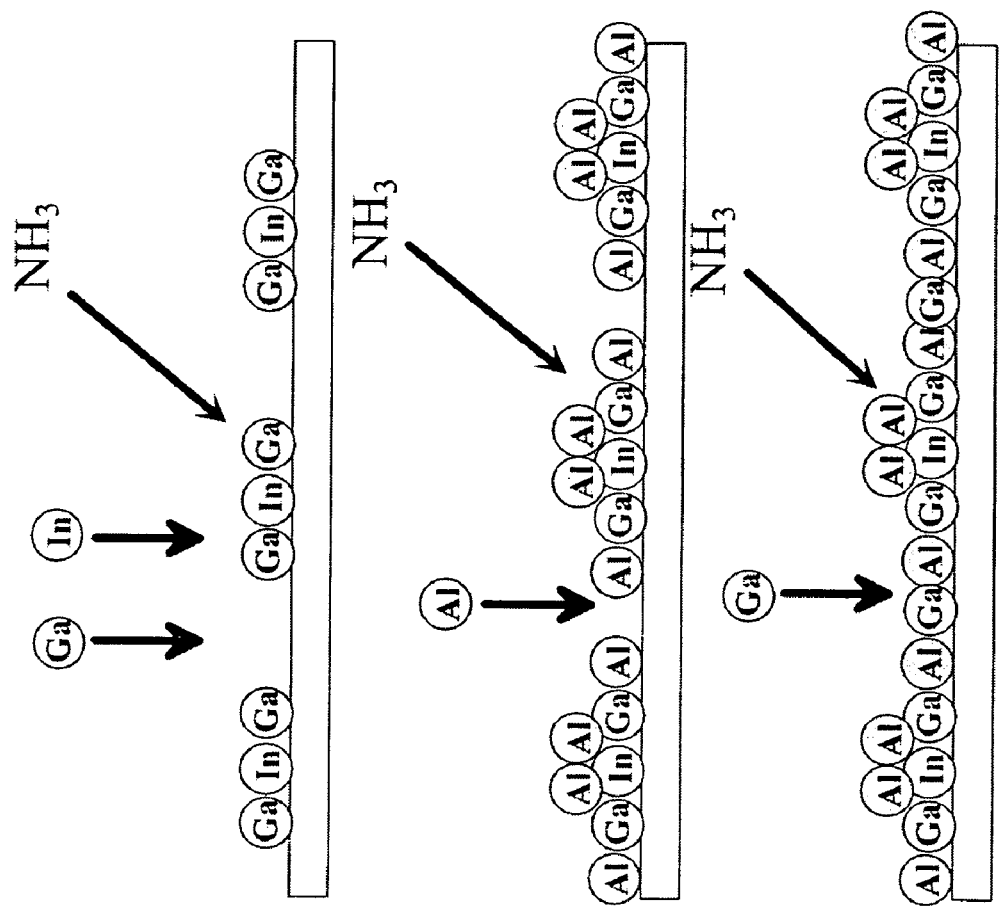
FIG. 8 diagrammatically shows a method for producing an active region including quantum dots of indium-containing group III-nitride material.

With reference to FIG. 8, one approach for producing indium-containing quantum dots is described. As shown in the top part of FIG. 8, GaN is deposited first to help capture In, forming an ordered layer of InGaN nucleation sites. This is followed by AlN or AlGaN deposition shown in the middle part of FIG. 8. A high electronegativity of AlN allows the material to stick uniformly throughout the film, encapsulating and confining the indium containing quantum dots, as shown in the bottom part of FIG. 8. Preferably, a size distribution of the quantum dots is monodisperse, with the standard deviation of quantum dot diameters being less than 50% of the mean, and more preferably being less than 20% of the mean. Preferably, the composition of the quantum dots, such as the indium content, is approximately constant. For example, a standard deviation in the indium content is preferably less than 0.05, and is more preferably less than 0.02. Among other advantages, quantum dots are zero dimensional quantum confinement systems that are more easily population-inverted versus quantum well layers, which leads to a reduction in threshold voltage for laser operation.

With returning reference to FIG. 7, the cladding layers 118, 122 are preferably GaN or AlGaN and have a larger bandgap than the materials of the active region 120 to promote carrier confinement in the active region 120. The cladding layers are typically grown at between about 650° C. and 1150° C by metalorganic chemical vapor deposition, and at between about 600° C. and 900° C. by molecular beam epitaxy. Optionally, the cladding layers 118, 122 are multiple-layer stacks containing one or more indium-containing layers to promote electrical conductivity.

The optional current spreading layer 124 promotes lateral distribution of electrical current across the large area resonant cavity light emitting device 108. In one suitable embodiment, the current spreading layer 124 is a superlattice including indium-containing layers. In another embodiment, the current spreading layer 124 includes a $p^+$ GaAlInN-to-$n^+$ GaAlInN tunnel junction, or a combination of a tunnel junction and a superlattice. In another embodiment, the current-spreading layer comprises a transparent or semi-transparent metal oxide $MO_x$, where $0 \leq x \leq 2$ and the metal M comprises at least one of indium, tin, zinc, gold, silver, copper, and nickel.

The mirror sub-stacks 116, 126 and the separation therebetween are readily selected using literature values for optical constants of the group III-nitride layers to provide a resonant cavity at the selected light emission wavelength. For example, for a 405 nm wavelength the mirror sub-stacks 116, 126 suitably include alternating layers of GaN and AlN of about 39 nm and 40 nm thickness, respectively. Such a DBR with sixteen periods is estimated to have a reflectivity of about 99.5% at 405 nm. To reduce lattice mismatch strain which is relatively high as between GaN and AlN, indium-containing layers can be incorporated. For example, a thirty period $In_{0.15}Al_{0.70}Ga_{0.15}N$/GaN DBR can be designed to have a reflectivity estimated at 98.6% at 460 nm.

Those skilled in the art can readily select other DBR structures for specific wavelengths and reflectivity characteristics. High optical contrast typically achieved with dissimilar materials (for example, GaN/AlN) and low strain typically achieved using alloys of more similar composition (for example, $In_{0.15}Al_{0.70}Ga_{0.15}N/GaN$) can be traded off at various intermediate compositions. The refractive index-thickness product of each layer preferably corresponds to a quarter-wavelength for high reflectivity. Moreover, rather than using abrupt layer interfaces, graded interfaces or a graded superlattice can be employed to reduce electrical resistance. The total refractive index-thickness product of the material between the mirror sub-stacks 116, 126 suitably corresponds to an integral number of half-wavelengths of the emission wavelength, such as a half wavelength or a single wavelength. Typically, the mirror sub-stacks 116, 126 are epitaxially deposited at temperatures between about 650° C. and 1150° C. for growth by metalorganic chemical vapor deposition, and between about 600° C. and 900° C. for growth by molecular beam epitaxy.

For operation as a resonant cavity light emitting diode in which light is collected through the gallium nitride substrate 106, a reflectivity of around 0.4 to 0.6 is preferred for the first mirror sub-stack 116 defining the n-type AlInGaN DBR. However, if light is collected from the epitaxial surface (that is, through the p-type DBR 126) then the n-DBR first mirror sub-stack 116 should have a reflectivity of at least about 0.8. For operation as a vertical cavity surface emitting laser, the reflectivity of the n-DBR first mirror sub-stack 116 should be between 0.95 and 0.999, and more preferably between 0.99 and 0.999.

For operation as a vertical cavity surface emitting laser, the ion implanted regions 138 provide lateral cavity confinement. Preferably, the ion implanted regions 138 define a lateral extent of the cavity that is between 1 micron and 100 microns corresponding to aperture areas of between 1 and 8000 square microns for circular apertures, and more preferably between 5 microns and 20 microns corresponding to aperture areas of between 20 and 315 square microns for circular apertures. For operation as a resonant cavity light emitting diode, lateral confinement is optional. Ions such as $He^+$, $H^+$, $O^+$, $N^+$, $F^+$, metal ions, or the like, with an energy between 10 keV and 1 MeV and a fluence of between about $10^{12}$ cm$^{-2}$ and $10^{14}$ cm$^{-2}$ are implanted in the p-type GaAlInN cladding layer 122 to form the implanted regions 138. The implantation conditions are preferably selected to avoid substantial penetration of the ions into the active region 120. Preferably, the ion implantation is performed after the deposition and annealing of the electrodes 130, 132 so that the lattice damage introduced by the ion implantation is not removed by the metallization processing.

Rather than defining the optical aperture using ion implantation, selective lateral oxidation can be employed. In this approach, an aluminum-rich group III-nitride layer is incorporated into the p-type GaAlInN cladding layer 122. Preferably, the group III content of the aluminum-rich group III-nitride layer is greater than 75% aluminum, and the layer preferably has a thickness of between 5 nm and 50 nm. After mesa formation, the outer diameter of the aluminum-rich group III-nitride layer is selectively oxidized by heating in an oxygen-containing atmosphere to convert outer portions of the aluminum-rich group III-nitride layer to $Al_2O_3$. The temperature and time of the oxidation process control the lateral extent of the aperture.

The resonant cavity light emitting device 108 shown in FIG. 7 is exemplary only. Those skilled in the art can make suitable modifications to adapt the device 108 for specific applications.

Figure 9:
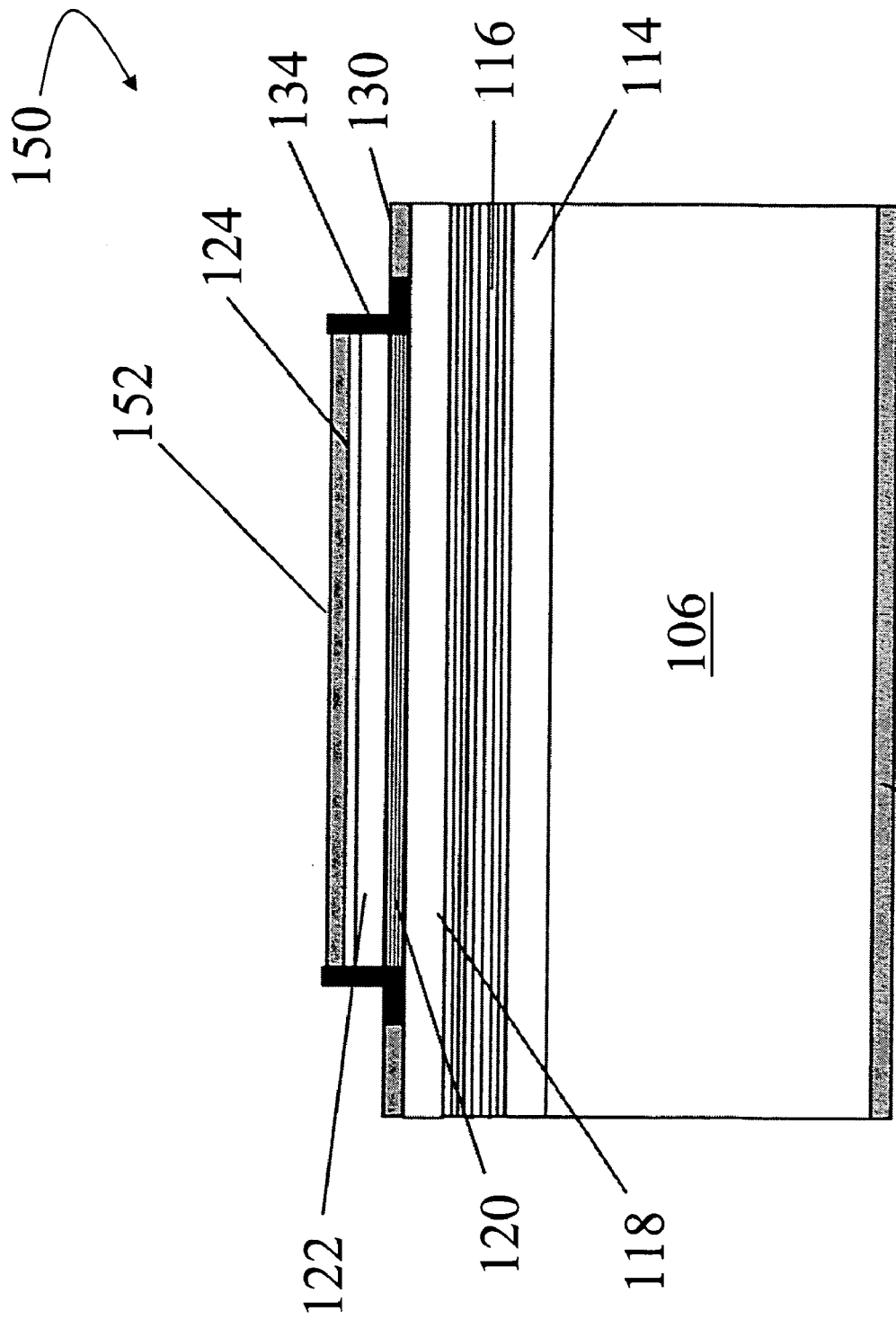
FIG. 9 shows an example resonant cavity light emitting diode layer structure having a reflective layer serving as an optical mirror and as a p-electrode.

With reference to FIG. 9, in one such adaptation suitable for a resonant cavity light emitting diode 150, the second mirror sub-stack 126 defining the p-type AlInGaN DBR is replaced by a reflective mirror layer 152 made of at least one of silver, gold, aluminum, platinum, rhodium, palladium, chromium, or the like. The mirror layer 152 is deposited over the current spreading layer 124 (or directly onto the p-type GaAlInN cladding layer 122 if the current spreading layer 124 is omitted) by thermal evaporation, electron beam evaporation, or another suitable technique. In this embodiment the frontside n-type electrode 130 is preferably employed to allow unimpeded substrate-side light emission. Alternatively, the frontside n-type electrode 130 is replaced by backside n-electrode 136, which is preferably substantially light-transmissive, for example including substantially transparent indium tin oxide or a thin light transmissive metal layer. Moreover, the reflective mirror layer 152 preferably serves as the p-type electrode, so that the p-type electrode 132 of the resonant cavity light emitting device 108 of FIG. 7 is omitted in the resonant cavity light emitting diode 150 of FIG. 9.

Figure 10:
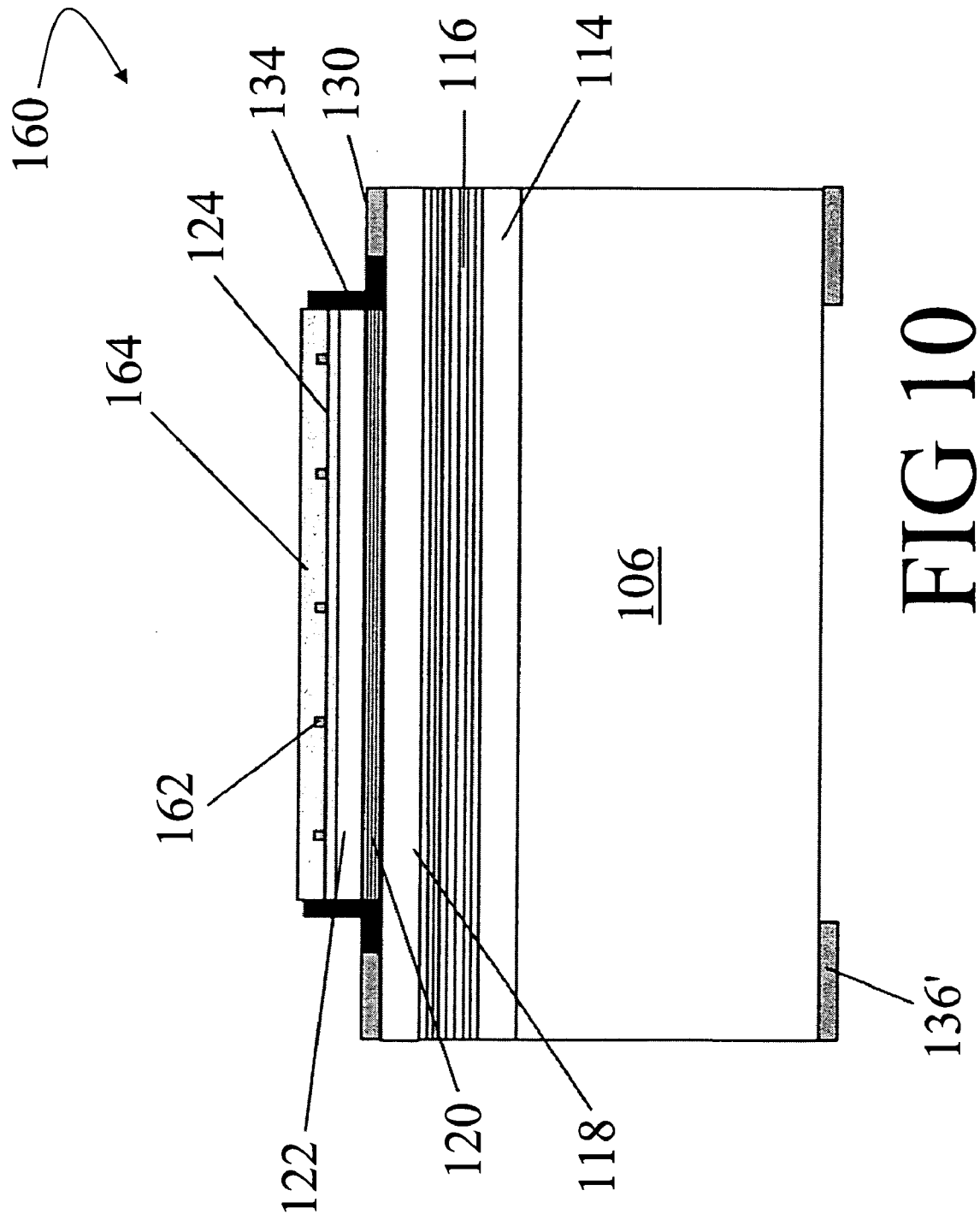
FIG. 10 shows an example resonant cavity light emitting diode layer structure having a reflective layer serving as an optical mirror disposed over a gridded p-electrode.

With reference to FIG. 10, another resonant cavity light emitting diode 160 is described, which is similar to the embodiment of FIG. 9 except that the reflective mirror layer 152 is replaced by a two-component mirror/p-electrode including a discontinuous p-electrode 162 and a reflective mirror layer 164. The discontinuous p-electrode 162 is optimized as an electrical contact and can be made, for example, of a nickel/gold or a platinum/gold stack where the nickel or platinum is about 20–200 nm thick and the gold is about 100 nm to 1 micron thick. In one suitable embodiment, the discontinuous p-electrode 162 is a gridded electrode having grid openings of between about 1 micron and 0.1 cm on a side. The reflective mirror layer 164 is suitably made of silver, gold, aluminum, platinum, rhodium, palladium, chromium, or the like, and is deposited over the current spreading layer 124 (or directly onto the p-type GaAlInN cladding layer 122 if the current spreading layer 124 is omitted) and over the gridded p-electrode 162. Preferably, the mirror layer 164 is deposited after any annealing processing of the discontinuous p-electrode 162 to reduce interdiffusion. Optionally, a diffusion barrier layer such as nickel, rhodium, platinum, palladium, iridium, ruthenium, rhenium, tungsten, molybdenum, niobium, tantalum, or $MC_xN_yO_z$ (where M includes a metallic element such as aluminum, boron, silicon, titanium, vanadium, chromium, yttrium, zirconium, lanthanum, or a rare earth metal, and x, y, z are each between 0 and 3) is disposed between the discontinuous p-electrode 162 and the mirror layer 164. Rather than a grid configuration, the p-electrode 162 can be arranged as an array of dots, rectangles, circles, or the like. The separation between the p-electrode array elements is preferably between about 1 micron and 0.1 cm. The use of a reflective metal p-electrode 152 or combination of reflective mirror layer 164 and discontinuous electrode 162 enables fabrication of large area resonant cavity light emitting diodes, for example, 50 mm or larger, without necessitating lateral carrier transport through p-doped layers over large distances.

Moreover, in the resonant cavity light emitting diode 160 the backside n-electrode 136 is modified as n-electrode 136' which includes an aperture opening for backside light emission. By providing the aperture opening, the n-electrode 136' is not restricted to substantially light-transmissive configurations. As another option, the backside n-electrode 136' can be replaced by the frontside n-electrode 130.

Figure 11:
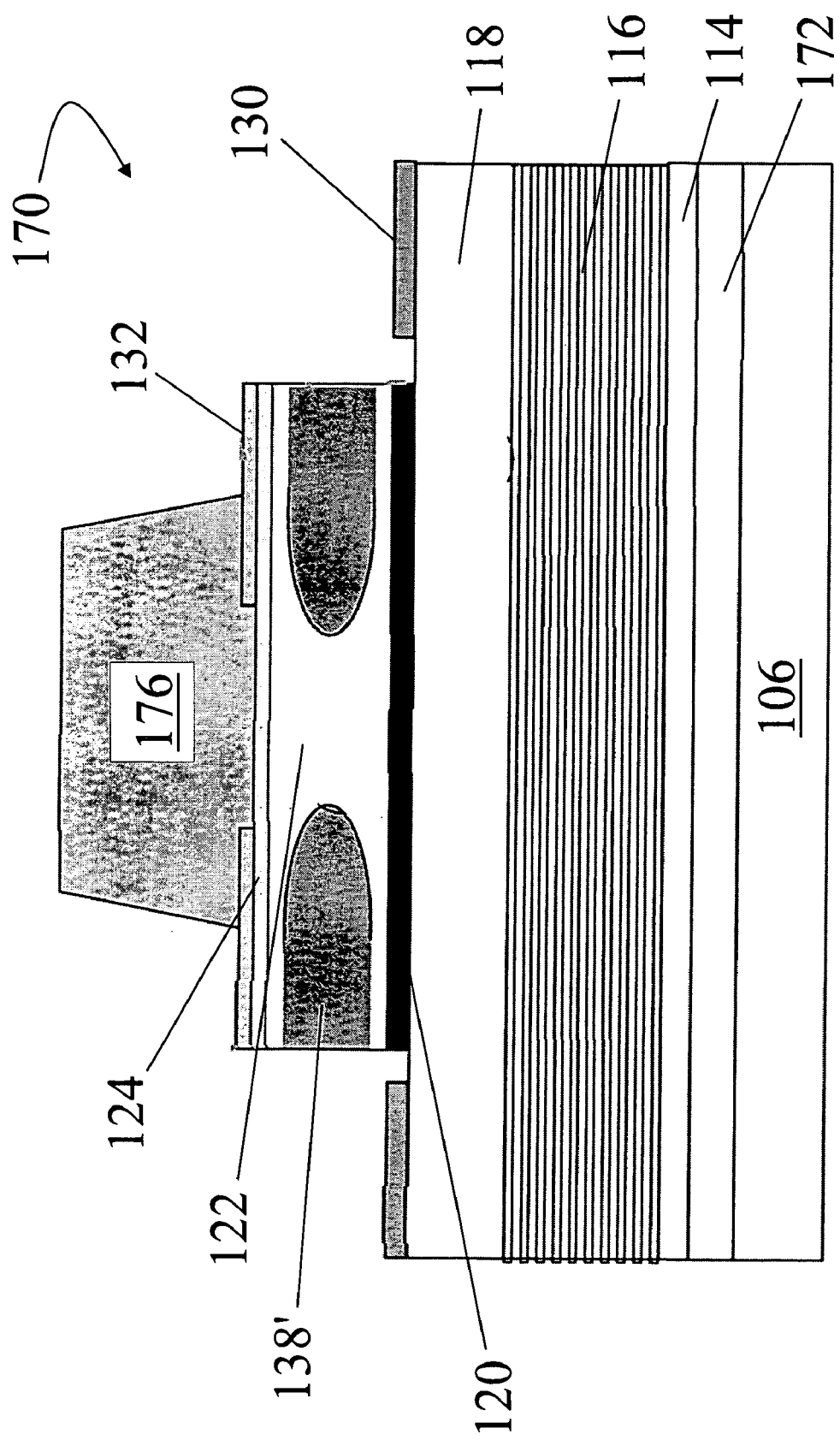
FIG. 11 shows an example resonant cavity light emitting device layer structure having a dielectric distributed Bragg reflector. This structure is suitable for use as a resonant cavity light emitting diode or as a vertical cavity surface emitting laser.

With reference to FIG. 11, a resonant cavity light emitting device 170 that with specific layer materials, compositions, and thicknesses is suitable for use as a resonant cavity light emitting diode or as a vertical cavity surface emitting laser is described. The device 170 of FIG. 11 is similar to the device 108 of FIG. 7, but has an optional current-spreading n+ AlInGaN/AlInGaN superlattice 172 disposed between the gallium nitride substrate 106 and the optional n+ GaN layer 114. Ion implanted regions 138' correspond to ion implanted regions 138, and the optional insulating material 134 is omitted in the device 170. The p-type second mirror substack 126 is replaced in the device 170 by a dielectric distributed Bragg reflector (DBR) stack 176.

Considerably higher refractive index contrasts are achievable with the dielectric DBR stack 176 as compared with the InAlGaN sub-stack 126. The dielectric materials of the dielectric DBR stack 176 are suitably metal oxides of the form $MO_xN_y$ where x and y are each between 0 and 2 and M includes a metallic element such as silicon, titanium, hafnium, magnesium, aluminum, calcium, vanadium, chromium, yttrium, zirconium, or a rare earth metal. The refractive index-thickness product for each $MO_xN_y$ layer is preferably an odd multiple of a quarter-wavelength of the emission light, and is more preferably a quarter-wavelength of the emission light. The metal oxide films can be deposited by thermal evaporation, electron beam evaporation, sputtering, or the like. As one example, a 15 period stack of $HfO_2/SiO_2$ can be designed to provide a reflectivity of 0.9998 at a wavelength of 405 nm.

High reflectivities achievable by using the dielectric DBR stack 176 are particularly beneficial in vertical cavity surface emitting lasers, but can also be used in resonant cavity light emitting diode devices. In preferred vertical cavity surface emitting laser or resonant cavity light emitting diode embodiments, the p-mirror defined by the dielectric DBR stack 176 is generally circular with a diameter of between about 5 microns and about 200 microns corresponding to a device aperture area of between about 20 square microns and 31,000 square microns. Preferably, the lateral extent of the dielectric DBR stack 176 is defined by lithographic masking prior to deposition of the DBR stack 176, which permits the p-electrode 132 to be deposited on top of the device after removal of the mask.

In one embodiment, where light is collected through the gallium nitride substrate 106, the substrate is doped with at least one luminescent atom or color center, for example, at least one of a transition or rare-earth metal such as Ti, V, Cr, Mn, Fe, Co, Ni, Zr, Hf, Pr, Eu, Er, or Tm. In another embodiment, a homoepitaxial layer of GaN containing at least one luminescent atom or color center is deposited on the gallium nitride substrate, below the n-DBR, within the cavity, above the p-DBR, or on the backside of the substrate. The homoepitaxial layer is deposited by methods that are well known in the art, such as molecular beam epitaxy or metalorganic chemical vapor deposition. The dopant or color center is preferably present at a concentration of at least $10^{17}$ cm$^{-3}$ and emits or produces luminescence at one or more wavelengths between 300 and 1000 nm. In this embodiment, a portion of the light emitted by the resonant cavity device is absorbed by the at least one luminescent atom or color center in the substrate, producing an electronically excited state. The excited state then relaxes, emitting light of a different color. In this way the resonant cavity device can emit light at two or more different wavelengths without the use of a separate phosphor. For example, red-luminescing GaN crystals can be synthesized by doping with Eu. Combination of blue, blue-green, or green light emitted by the active layer of the resonant cavity device and red, orange, yellow, and/or green light emitted by the substrate can produce white light.

Figure 12:
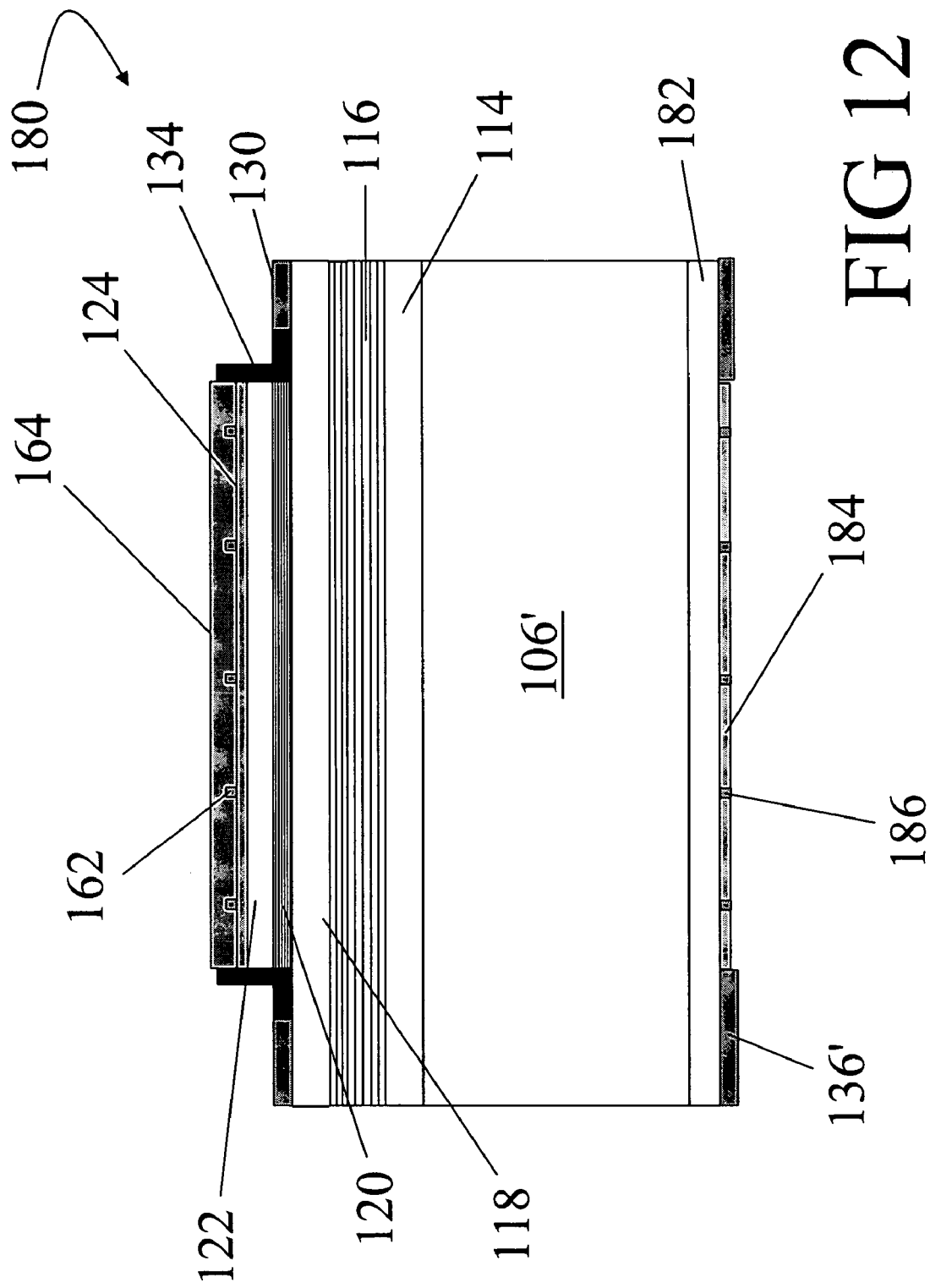
FIG. 12 shows an example resonant cavity light emitting device layer structure having a luminescent substrate or epitaxial layer and a secondary mirror defining a cavity for at least one additional wavelength of light.

With reference to FIG. 12, a resonant cavity light emitting diode 180 is described, that is similar to the resonant cavity light emitting diode 160 of FIG. 10 except for additional structure disposed on a backside of substrate 106'. Moreover, the substrate 106' is substantially similar to the substrate 106 of FIG. 10 except that the substrate 106' is optionally doped with a luminescent dopant. A secondary cavity is employed with the luminescent substrate 106' or with a luminescent layer 182 disposed on the backside of the substrate 106' in order to provide for directional emission of at least two wavelengths of light. The luminescent substrate 106' is suitably a gallium nitride substrate containing at least one of a transition or rare-earth metal such as Ti, V, Cr, Mn, Fe, Co, Ni, Zr, Hf. Pr, Eu, Er, or Tm, substantially free of tilt boundaries and having a dislocation density less than about $10^4$ cm$^{-2}$. In another embodiment, luminescence is provided by the luminescent layer 182, which can be a GaN epitaxial layer doped with at least one of a transition or rare-earth metal such as Ti, V, Cr, Mn, Fe, Co, Ni, Zr, Hf, Pr, Eu, Er, or Tm. Luminescence at two or more wavelengths in addition to the primary wavelength emitted by the active layer may be achieved by doping with two or more metal atoms or color centers. The luminescent layer 182 may be deposited on the backside of the substrate, as shown in FIG. 12, or may be deposited between the substrate 106' and the n-DBR 116, within the primary cavity, or above the p-DBR if a p-DBR is used for the p-type mirror. In another embodiment, luminescence is provided by a second substrate (not shown) that is wafer-bonded to the backside of the gallium nitride substrate by a suitable bonding method. Examples of such a second substrate include ruby (Ti-doped sapphire) and cerium-doped yttrium aluminum garnet.

In one embodiment, a second cavity is provided for directional emission of one or more additional wavelengths of light from the luminescent substrate 106' or luminescent layer 182. A secondary mirror 184 is deposited on the bottom side of the substrate or luminescent layer, as shown in FIG. 12. The mirror 182 may be wavelength-specific, such as a distributed Bragg reflector, or may be broadband, as with a thin, partially-reflecting metal layer such as a partially silvered layer. If a broadband secondary mirror is employed, the n-DBR 116 between the substrate 106' and the active layer 120 is optionally omitted. In one embodiment, improved electrical contact to the substrate 106' is advantageously achieved using a two-component mirror/n-electrode including a discontinuous n-electrode 186 and the reflective mirror layer 184. The discontinuous n-electrode 186 is optimized as an electrical contact and can be made, for example, of a titanium/aluminum, titanium/aluminum/ titanium/gold, titanium/aluminum/nickel/gold, or titanium/ aluminum/platinum/gold stack where the thickness of each layer in the stack is between about 10 and about 2000 nm thick. The first Ti layer is preferably between 10 and 30 nm thick, the Al layer between 50 and 300 nm thick, and the outermost layers between 30 and 2000 nm thick. In one suitable embodiment, the discontinuous n-electrode 186 is a gridded electrode having grid openings of between about 1 micron and 0.5 cm on a side. The reflective mirror layer 184 is suitably made of silver, gold, aluminum, platinum, rhodium, palladium, chromium, or the like, and is deposited over the luminescent substrate 106' or the luminescent layer 182 and over the gridded n-electrode 186. Preferably, the mirror layer 184 is deposited after any annealing processing of the discontinuous n-electrode 186 to reduce interdiffusion. Optionally, a diffusion barrier layer such as nickel, rhodium, platinum, palladium, iridium, ruthenium, rhenium, tungsten, molybdenum, niobium, tantalum, or $MC_xN_yO_z$ (where M includes a metallic element such as aluminum, boron, silicon, titanium, vanadium, chromium, yttrium, zirconium, lanthanum, or a rare earth metal, and x, y, z are each between 0 and 3) is disposed between the discontinuous n-electrode 186 and the mirror layer 184. Rather than a grid configuration, the discontinuous n-electrode 186 can be arranged as an array of dots, rectangles, circles, or the like. The separation between the n-electrode array elements is preferably between about 1 micron and 0.5 cm. To promote efficient light emission over the device, the front and back surfaces of the substrate 106' and the luminescent layer 182, if employed, should be parallel to less than $0.1\lambda$, where $\lambda$ is the smallest wavelength of the light resonating in the secondary cavity. The thickness of the cavity and/or the luminescent layer 182 should be chosen so that the optical thickness is an integral number of half-wavelengths. If two or more different wavelengths are to be confined by the cavity, the wavelengths and thickness should be chosen so that the optical thickness is an integral number of one-half of each wavelength. With the cavities defined as in FIG. 12, the cavity for the secondary wavelength or wavelengths also includes the cavity for the primary light emitted by the active layer. The optical path length of the primary cavity must therefore be taken into account for the optical path length of the secondary cavity but will otherwise not introduce major complications since the secondary wavelengths will be off-resonance for the primary cavity (via the n-DBR). In FIG. 12, the primary cavity is defined by the p-mirror 164 and the n-DBR 116, while the secondary cavity is defined by the p-mirror 164 and the partially reflective mirror layer 184. Thus, the primary and secondary cavities are defined by two metallized mirrors and one DBR. In various other contemplated embodiments, various combinations of 1–3 AlInGaN DBRs, 0–2 mixed-oxide DBRs, and 0–2 metallic or partially-metallized mirrors are used to define the primary optical cavity and optionally the secondary optical cavity, and light may be emitted either through the substrate or through the top mirror.

The exemplary resonant cavity light emitting devices 108, 150, 160, 170, 180 have a p-on-n configuration: that is, the n-type material is adjacent the gallium nitride substrate 106, 106' while the p-type material is distal from the gallium nitride substrate 106, 106'. For backside electrical contact, the gallium nitride substrate should be conductive, doped n-type by including a suitable dopant source in the capsule 10 such as a silicon or oxygen precursor. The doping preferably produces a substrate resistivity of less than 10 ohm-cm, and more preferably of less than 1 ohm-cm. For devices employing frontside contacts, the gallium nitride substrate can be n-type, undoped, or p-type, but is preferably n-type with electrical resistivity less than about 10 ohm-cm. Devices with an n-on-p configuration are also contemplated. For n-on-p devices, the gallium nitride substrate should be p-type and the polarities of the InAlGaN layers 112 and electrical contacts 130, 132, and 136 should be inverted.

The resonant cavity light emitting devices 108, 150, 160, 170, 180 are exemplary only. Those skilled in the art can readily modify these exemplary devices by including additional or different layers to implement specific electrical, optical, or structural features, by removing layers of limited value for a specific device application, and so forth. Although uniform group III-nitride layers are shown, it is also contemplated to incorporate graded layers into the resonant cavity light emitting device structures, for example to improve vertical current flow.

The resonant cavity light emitting devices 108, 150, 160, 170, 180, or similar devices, include or are fabricated on the low dislocation density gallium nitride substrate 106, 106' which has substantially no tilt boundaries. These devices have substantial advantages over similar devices including or fabricated on other substrates such as higher dislocation density gallium nitride substrates with dislocation densities in excess of $10^4$ cm$^{-2}$, epitaxial lateral overgrowth gallium nitride substrates having high densities of tilt boundaries, or dissimilar (that is, non-gallium nitride) substrates such as sapphire or silicon carbide substrates. Residual stress or strain resulting from the presence of tilt boundaries or a dissimilar substrate can accelerate the degradation of laser diodes or high power resonant cavity light emitting diodes. Similarly, dislocations typically reduce the lifetime of resonant cavity light emitting devices.

The relatively thick epitaxial DBR layers in resonant cavity devices can generate significant strain and lead to cracks, which may nucleate at tilt boundaries or dislocations. The use of a strain- and tilt-boundary-free GaN substrate, with zero lattice- and thermal-expansion mismatch and extremely low dislocation density will minimize the likelihood of crack formation. The substrate produced by the presently described superheated fluid-mediated recrystallization process is particularly advantageous for resonant cavity light emitting devices that have thick epitaxial layer stacks compared with typical light emitting diodes and edge-emitting laser diodes.

The resonant cavity light emitting devices described herein can be mounted in conventional fashion in which light is extracted from the frontside of the device. Alternatively, the substantial transparency of the gallium nitride substrate supports operation in a flip-chip arrangement in which light is extracted from the backside of the resonant cavity light emitting device. Such a device can be mounted using flip chip bonding of front side p-type and n-type contacts, thus eliminating wire bonding or the like. Alternatively, the resonant cavity light emitting device can be flip-chip bonded using a single frontside contact, and a backside contact is made by wire bonding or the like to a conductive substrate.

Figure 13:
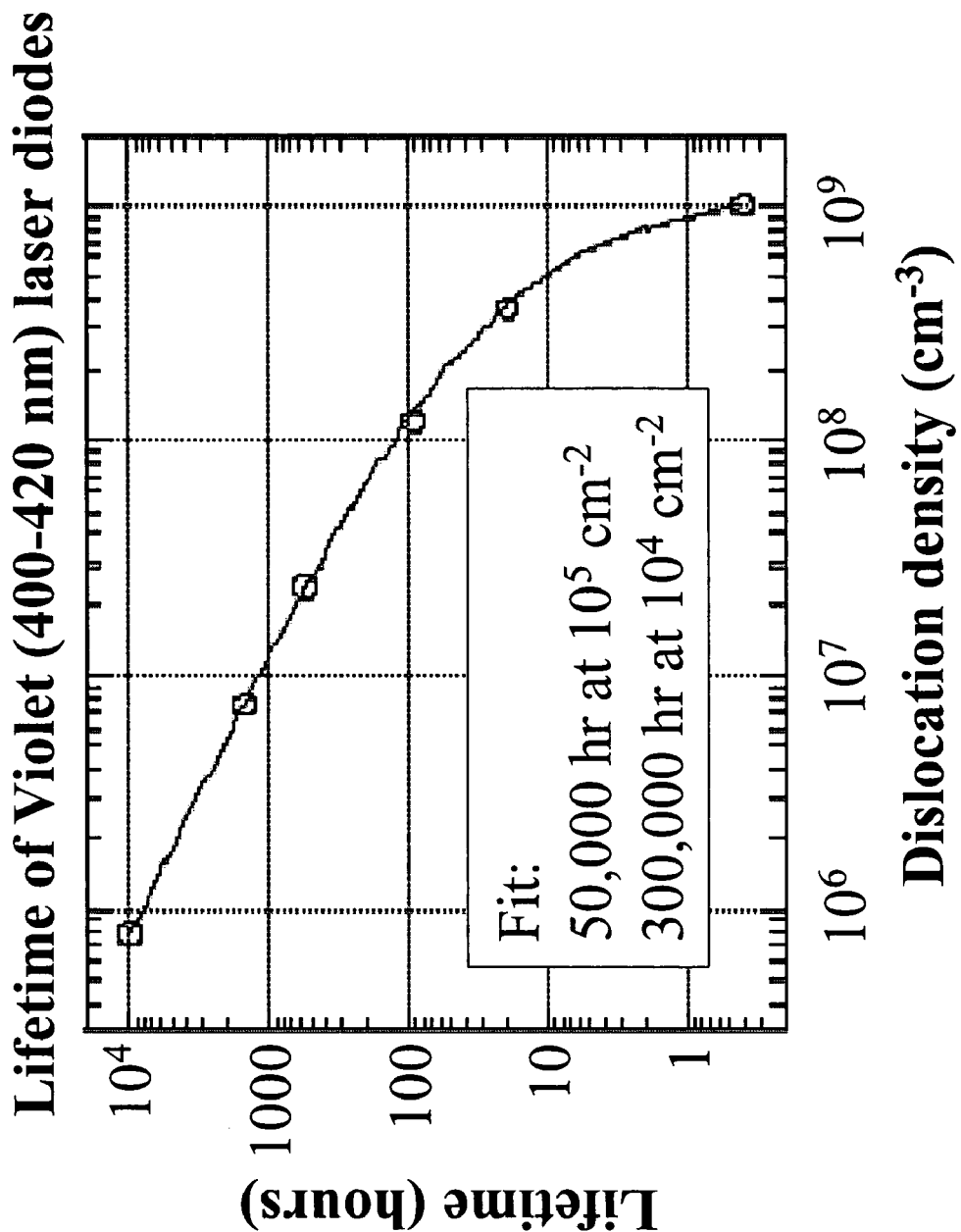
FIG. 13 plots device lifetime versus dislocation density for edge emitting laser diodes emitting in a wavelength range of 400–420 nm.

With reference to FIG. 13, the effect of dislocation density on the lifetime of edge-emitting laser diodes is illustrated. Device lifetime is seen to decrease rapidly with increasing dislocation density. Similar behavior is expected of resonant cavity light emitting diodes and vertical cavity surface emitting lasers, particularly when operated at similar current densities. Degradation of device lifetimes by dislocations may result from dislocation-enhanced impurity diffusion into the active layer, from facile generation of new dislocations, or the like. Dislocations also can act as non-radiative recombination centers, electrical shunt paths, or the like, which degrade light emission efficiency. The presence of even a single dislocation within a group III-nitride based resonant cavity light emitting device can degrade its performance and/or lifetime.

With returning reference to FIG. 6A, in one preferred embodiment the individual devices 108 fabricated on the single-crystal gallium nitride wafer 106 are separated by dicing the gallium nitride wafer 106, and the individual device die are die-bonded to a sub-mount and epoxy encapsulated, or otherwise packaged as discrete light emitting devices. For white light sources, the devices 108 are preferably coated with a phosphor-containing epoxy or otherwise optically communicate with a white-light producing phosphor.

With reference to FIG. 14, in another preferred embodiment, the gallium nitride substrate 106, or a portion thereof containing a selected array of the resonant cavity light emitting devices 108, is utilized as a light emitting array component 200. In this embodiment, the devices 108 preferably are configured for backside light emission and employ frontside electrical contacts. Electrical contact is suitably made using a probing card 202 having individually addressable p-contact points 204 that mate with corresponding p-electrodes 132, which may extend over the p-type mirror as shown, for example, in the devices 150, 160 of FIGS. 9 and 10. The probing card 202 is disposed over the frontside (that is, the side on which the devices 108 are disposed) of the gallium nitride substrate 106 as indicated by the arrow 206. The array of resonant cavity light emitting devices share a common n-contact 130, as shown in the devices 150, 160 of FIGS. 9 and 10, in the shape of a grid. Optionally, an optical coupling element 210 is disposed over the backside of the gallium nitride substrate 106. The optical coupling element 210 can be an epoxy film or other index-matching film, an index-matching light-transmissive cover, or the like. Rather than the illustrated continuous optical coupling element 210, individual lensing elements corresponding to the devices 108 can arranged on the backside of the substrate 106. Light is extracted from the backside of the gallium nitride substrate 106, as diagrammatically indicated by arrows 212.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. A resonant cavity light emitting device including:
    a stack of group III-nitride layers having no tilt-boundaries and having a dislocation density less than $10^4$ $cm^{-2}$, the stack including a first mirror sub-stack defining a distributed Bragg reflector and an active region; and
    a mirror cooperating with the first mirror sub-stack to define a resonant cavity inside of which the active region is disposed.

2. The resonant cavity light emitting device as set forth in claim 1, wherein the stack of group III-nitride layers have a minimum lateral dimension greater than 0.1 cm.

3. The resonant cavity light emitting device as set forth in claim 1, wherein the mirror includes:
    a reflective stack of one or more layers disposed over a surface of the stack of group III-nitride layers distal from the first mirror sub-stack.

4. The resonant cavity light emitting device as set forth in claim 3, wherein the reflective stack includes:
    a reflective metal layer.

5. The resonant cavity light emitting device as set forth in claim 4, further including:
    a discontinuous electrode disposed on the surface of the stack of group III-nitride layers distal from the first mirror sub-stack, the discontinuous electrode being in electrical contact with the stack of group III-nitride layers.

6. The resonant cavity light emitting device as set forth in claim 1, wherein the mirror includes:
    a second mirror sub-stack of group III-nitride layers defining a distributed Bragg reflector.

7. The resonant cavity light emitting device as set forth in claim 1, wherein the mirror includes:
    a dielectric stack defining a distributed Bragg reflector.

8. The resonant cavity light emitting device as set forth in claim 1, wherein the stack of group III-nitride layers has a dislocation density less than $10^3$ $cm^{-2}$.

9. The resonant cavity light emitting device as set forth in claim 1, wherein the stack of group III-nitride layers has a dislocation density less than 100 $cm^{-2}$.

10. The resonant cavity light emitting device as set forth in claim 1, wherein the stack of group III-nitride layers include trenches formed therein, each trench extending at least through the active region to define laterally spaced islands of the active region, portions of the stack of group III-nitride layers extending between the laterally spaced islands of the active region containing substantially no edge dislocation arrays.

11. The resonant cavity light emitting device as set forth in claim 1, wherein the active region of the stack of group III-nitride layers includes:
    a region of indium-containing quantum dots.

12. The resonant cavity light emitting device as set forth in claim 1, further including:
    a single-crystal gallium nitride substrate substantially free of tilt-boundaries on which the stack of group III-nitride layers is disposed, the single-crystal gallium nitride substrate having a dislocation density less than $10^4$ $cm^{-2}$.

13. The resonant cavity light emitting device as set forth in claim 12, wherein the single-crystal gallium nitride substrate has an optical absorption coefficient that is generally less than 5 $cm^{-1}$ over a spectral range between 465 nm and 700 nm.

14. The resonant cavity light emitting device as set forth in claim 13, wherein the single-crystal gallium nitride substrate is electrically conductive.

15. The resonant cavity light emitting device as set forth in claim 14, wherein the electrically conductive single-crystal gallium nitride substrate has a resistivity of less than 10 ohm-cm.

16. The resonant cavity light emitting device as set forth in claim 1, wherein the stack of group III-nitride layers has a (11$\underline{2}$0) oriented principal surface.

17. The resonant cavity light emitting device as set forth in claim 1, wherein the stack of group III-nitride layers has a (1$\underline{1}$00) oriented principal surface.

18. The resonant cavity light emitting device as set forth in claim 1, wherein the stack of group III-nitride layers has a (0001) oriented principal surface.

19. The resonant cavity light emitting device as set forth in claim 1, wherein the stack of group III-nitride layers has a (000$\underline{1}$) oriented principal surface.

20. A resonant cavity light emitting device including:
    a stack of group III-nitride layers including an active region;
    a single-crystal gallium nitride substrate substantially free of tilt-boundaries on which the stack of group III-nitride layers is disposed, the single-crystal gallium nitride substrate having a dislocation density less than $10^4$ $cm^{-2}$; and
    first and second mirrors defining a resonant cavity inside of which the active region is disposed, light produced by the active region resonating in the resonant cavity, at least one of the first and second mirrors including a distributed Bragg reflector.

21. The resonant cavity light emitting device as set forth in claim 20, further including:
    a luminescent material or dopant disposed on or in the single crystal gallium nitride substrate that produces luminescence light of wavelength in a range between 300 nm and 1000 nm inclusive, the luminescence light being spectrally different from the light produced by the active region.

22. The resonant cavity light emitting device as set forth in claim 21, wherein the luminescent material or dopant comprises at least one of Ti, V, Cr, Mn, Fe, Go, or a rare earth metal.

23. The resonant cavity light emitting device as set forth in claim 20, further including:
a third mirror cooperating with one of the first and second mirrors to define a second resonant cavity, the luminescence light resonating in the second resonant cavity.

24. The resonant cavity light emitting device as set forth in claim 23, wherein each of the first, second, and third mirrors is independently selected from a group consisting of:
a semiconductor distributed Bragg reflector defined by the stack of group III-nitride layers,
a mixed oxide distributed Bragg reflector, and
a metallic or partially-metallized mirror.

25. A resonant cavity light emitting device including:
a single-crystal gallium nitride substrate having a characteristic absorption peak at about 3175 $cm^{-1}$ with an absorbance per unit thickness greater than about 0.01 $cm^{-1}$.
a stack of group III-nitride layers disposed on the single-crystal gallium nitride substrate, the stack including a first mirror sub-stack and an active region; and
a mirror cooperating with the first mirror sub-stack to define a resonant cavity inside of which the active region is disposed.

26. The resonant cavity light emitting device of claim 25, wherein the single-crystal gallium nitride substrate has a fluorine concentration greater than about 0.04 ppm.

27. The resonant cavity light emitting device of claim 26, wherein the single-crystal gallium nitride substrate is substantially free of tilt-boundaries and has a dislocation density less than 100 $cm^{-2}$.

28. A resonant cavity light emitting device including:
a stack of group III-nitride layers including an active region;
a single-crystal gallium nitride substrate substantially free of tilt-boundaries on which the stack of group III-nitride layers is disposed, the single-crystal gallium nitride substrate having a dislocation density less than $10^2$ $cm^{-2}$; and
first and second mirrors defining a resonant cavity inside of which the active region is disposed, light produced by the active region resonating in the resonant cavity.

29. A resonant cavity light emitting device including:
a stack of group III-nitride layers including an active region;
a single-crystal gallium nitride substrate substantially free of tilt-boundaries on which the stack of group III-nitride layers is disposed, the single-crystal gallium nitride substrate having a dislocation density less than $10^4$ $cm^{-2}$; and
first and second mirrors arranged parallel with the active region and defining a vertical resonant cavity inside of which the active region is disposed, light produced by the active region resonating in the resonant cavity.

* * * * *